United States Patent
Kim et al.

(10) Patent No.: US 12,364,083 B2
(45) Date of Patent: *Jul. 15, 2025

(54) DISPLAY DEVICE

(71) Applicant: SAMSUNG DISPLAY CO., LTD., Yongin-si (KR)

(72) Inventors: Kyung Bae Kim, Seongnam-si (KR); Hyun Joon Kim, Hwaseong-si (KR); Kyung Hoon Chung, Yongin-si (KR); Mee Hye Jung, Suwon-si (KR); Min Jae Jeong, Hwaseong-si (KR); Jun Ki Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/636,253

(22) Filed: Apr. 15, 2024

(65) Prior Publication Data

US 2024/0258492 A1 Aug. 1, 2024

Related U.S. Application Data

(63) Continuation of application No. 17/260,963, filed as application No. PCT/KR2019/001672 on Feb. 12, 2019, now Pat. No. 11,961,950.

(30) Foreign Application Priority Data

Jul. 17, 2018 (KR) .................... 10-2018-0083107

(51) Int. Cl.
*H10H 20/857* (2025.01)
*G09G 3/32* (2016.01)
(Continued)

(52) U.S. Cl.
CPC ....... *H10H 20/857* (2025.01); *H01L 25/0753* (2013.01); *H10H 20/8316* (2025.01); *G09G 3/32* (2013.01); *G09G 2300/0426* (2013.01)

(58) Field of Classification Search
None
See application file for complete search history.

(56) References Cited

U.S. PATENT DOCUMENTS 8,354,978 B2   1/2013  Ozawa et al.
8,570,245 B2  10/2013  Iida et al.
(Continued)

FOREIGN PATENT DOCUMENTS

CN   101853631 A   10/2010
CN   107611153 A    1/2018
(Continued)

OTHER PUBLICATIONS

International Search Report for corresponding Application No. PCT/KR2019/001672 dated Feb. 12, 2019, 12pp.

*Primary Examiner* — Alexander G Ghyka
(74) *Attorney, Agent, or Firm* — Womble Bond Dickinson (US) LLP

(57) ABSTRACT

A display device comprises a substrate, a semiconductor layer thereon, a first insulating layer on the semiconductor layer, a first conductive layer on the first insulating layer and including a first electrode pattern, a second insulating layer on the first insulating layer and including first and second conductive patterns, a third insulating layer on the second conductive layer, and a display element layer on the third insulating layer and including a first pixel electrode connected to the first conductive pattern through a first via hole, a second pixel electrode connected to the second conductive pattern through a second via hole, and a micro light-emitting element between the pixel electrodes, the first conductive pattern contacting the semiconductor layer through a first (Continued)

contact hole and the first electrode pattern through a second contact hole, and the second conductive pattern overlapping the first electrode pattern to form a first capacitor therewith.

20 Claims, 22 Drawing Sheets

(51) Int. Cl.
*H01L 25/075* (2006.01)
*H10H 20/831* (2025.01)

(56) References Cited

U.S. PATENT DOCUMENTS

| | | | |
|---|---|---|---|
| 10,255,855 B2 | 4/2019 | Park et al. | |
| 11,961,950 B2 * | 4/2024 | Kim | H01L 33/62 |
| 2006/0054894 A1 | 3/2006 | Miyake et al. | |
| 2012/0037932 A1 | 2/2012 | Miyake et al. | |
| 2013/0265533 A1 | 10/2013 | Lim et al. | |
| 2014/0103387 A1 | 4/2014 | Miyake et al. | |
| 2015/0379955 A1 | 12/2015 | Jeon et al. | |
| 2016/0262230 A1 * | 9/2016 | Park | H01L 25/167 |
| 2017/0092211 A1 | 3/2017 | Xu et al. | |
| 2017/0124954 A1 * | 5/2017 | Park | G09G 3/3258 |
| 2017/0294565 A1 | 10/2017 | Kim | |
| 2017/0337870 A1 | 11/2017 | Lim et al. | |
| 2017/0338211 A1 | 11/2017 | Lin et al. | |
| 2018/0019369 A1 | 1/2018 | Cho et al. | |
| 2018/0069190 A1 * | 3/2018 | Kim | H10K 59/1213 |
| 2018/0097054 A1 | 4/2018 | Iida et al. | |
| 2018/0101259 A1 * | 4/2018 | No | G06F 21/32 |
| 2018/0122298 A1 | 5/2018 | Lee et al. | |
| 2018/0175009 A1 | 6/2018 | Kim et al. | |
| 2018/0190615 A1 | 7/2018 | Pan | |
| 2018/0198018 A1 | 7/2018 | Kim et al. | |
| 2018/0198042 A1 | 7/2018 | Kim | |
| 2018/0308424 A1 | 10/2018 | Toyoda et al. | |
| 2018/0358339 A1 | 12/2018 | Iguchi | |
| 2020/0295223 A1 | 9/2020 | Cho et al. | |
| 2021/0358897 A1 | 11/2021 | Iguchi | |
| 2021/0391496 A1 | 12/2021 | Cho et al. | |

FOREIGN PATENT DOCUMENTS

| | | |
|---|---|---|
| CN | 108022550 A | 5/2018 |
| JP | 2014013404 A | 1/2014 |
| KR | 10-2010-0067624 A | 6/2010 |
| KR | 10-2014-0087591 A | 7/2014 |
| KR | 10-2017-0049787 A | 5/2017 |
| KR | 10-2017-0084139 A | 7/2017 |
| KR | 10-2017-0094930 A | 8/2017 |
| KR | 20170116633 A | 10/2017 |
| KR | 2018/0007376 A | 1/2018 |
| KR | 10-2018-0074667 A | 7/2018 |
| WO | WO 2017/094461 A1 | 6/2017 |

* cited by examiner

DISPLAY DEVICE

CROSS-REFERENCE TO RELATED APPLICATIONS

This application is a continuation of U.S. patent application Ser. No. 17/260,963, filed Jan. 15, 2021, which is a National Phase Patent Application and claims priority to and the benefit of International Application Number PCT/KR2019/001672, filed on Feb. 12, 2019, which claims priority to Korean Patent Application Number 10-2018-0083107, filed Jul. 17, 2018, the entire content of all of which is incorporated herein by reference.

TECHNICAL FIELD

The present disclosure relates to a display device including light-emitting diodes (LEDs).

BACKGROUND ART

Light-emitting diodes (LEDs), which are devices that convert electrical signals into light, such as infrared light or visible light, with the use of the characteristics of a compound semiconductor, have been used in home appliances, remote controls, electronic display boards, and various automated machines, and their range of application has increasingly expanded.

Attempts have been made to apply LEDs to display devices. For example, attempts have been made to use LEDs as backlights of display devices or to miniaturize LEDs into micro pixel units capable of displaying an image and thereby implement self-emitting display devices.

Thus, a structure that can integrate multiple LEDs thereinto is needed to miniaturize LEDs and to secure sufficient brightness for use in various types of devices.

DISCLOSURE

Technical Problems

As LEDs are miniaturized, the parasitic capacitance of the LEDs decreases.

As a result, the voltage of the first electrodes of the LEDs may be relatively considerably affected by voltage variations in the neighboring nodes so that the LEDs may malfunction or mistakenly emit light.

Accordingly, the present disclosure provides a display device capable of causing LEDs to stably emit light.

The technical problems related to the present disclosure are not limited to those mentioned set forth herein, and various other technical problems not mentioned herein will be apparent to those skilled in the art upon examination of the following.

Technical Solutions

According to some embodiments of the present disclosure, a display device comprises a substrate, a semiconductor layer disposed on the substrate, a first insulating layer disposed on the substrate and the semiconductor layer, a first conductive layer disposed on the first insulating layer and including a first electrode pattern, a second insulating layer disposed on the first insulating layer and the first electrode pattern and including first and second conductive patterns, a third insulating layer disposed on the second conductive layer and a display element layer disposed on the third insulating layer and including a first pixel electrode, which is electrically connected to the first conductive pattern through a first via hole that penetrates the third insulating layer, a second pixel electrode, which is electrically connected to the second conductive pattern through a second via hole that penetrates the third insulating layer, and a micro light-emitting element, which is disposed between the first and second pixel electrodes, wherein the first conductive pattern is in contact with the semiconductor layer through a first contact hole that penetrates the first and second insulating layers and with the first electrode pattern through a second contact hole that penetrates the second insulating layer, and the second conductive pattern overlaps in part with the first electrode pattern to form a first capacitor with the first electrode pattern.

The first and second pixel electrodes may be disposed to face each other and be spaced apart from each other, in the same layer, and the micro light-emitting element may be an inorganic light-emitting diode.

The first electrode pattern may form a first electrode of the first capacitor, and part of the second conductive pattern that overlaps with the first electrode pattern may form a second electrode of the first capacitor.

A common voltage may be applied to the second conductive pattern.

The sum of parasitic capacitance of the micro light-emitting element and capacitance of the first capacitor may be uniform.

The capacitance of the first capacitor may be 0.1 pF to 0.3 pF.

The display device may further comprise a gate insulating layer disposed between the semiconductor layer and the first insulating layer; and a gate electrode disposed between the gate insulating layer and the first insulating layer to overlap with the semiconductor layer.

A thickness of the second insulating layer may be 5000 Å to 7000 Å.

The first conductive layer may further include a gate electrode that overlaps with the semiconductor layer, and an overlapping area of the semiconductor layer and the gate electrode pattern may form a channel of a transistor.

A thickness of the second insulating layer may be 6000 Å to 9000 Å.

The display device may further comprise an interlayer insulating layer disposed between the first conductive layer and the second insulating layer and a third conductive layer disposed between the interlayer insulating layer and the second insulating layer, wherein the third conductive layer may include a second electrode pattern that is disposed between the first electrode pattern and the second conductive pattern to overlap with the first electrode pattern, and the second conductive pattern may be in contact with the second electrode pattern through a third contact hole that penetrates the second insulating layer to expose the second electrode pattern.

A thickness of the interlayer insulating layer may be 1500 Å to 3000 Å.

The display device may further comprise a gate insulating layer disposed between the semiconductor layer and the first insulating layer; and a third conductive layer including a second electrode pattern that is disposed between the gate insulating layer and the first insulating layer to overlap with the first electrode pattern, wherein the second conductive pattern may be in contact with the second electrode pattern through a third contact hole that penetrates the first and second insulating layers to expose the second electrode pattern.

The first electrode pattern and the second conductive pattern may form a first capacitor, the first and second electrode patterns may form a second capacitor, and the first capacitor may be connected in parallel to the second capacitor.

The third contact hole may be formed to penetrate the first electrode pattern, and the first electrode pattern and the second conductive pattern may be insulated by the second insulating layer, on edges of the third contact hole.

The display device may further comprise a fourth insulating layer disposed on the first and second pixel electrodes, located between the first and second pixel electrodes, and having the micro light-emitting element disposed thereon, a fifth insulating layer covering the micro light-emitting element to expose both ends of the micro light-emitting element, a first contact electrode electrically connected to the first pixel electrode and disposed on the organic insulating layer to be in contact with a first end of the micro light-emitting element, exposed by the first passivation layer and a second contact electrode electrically connected to the second electrode and disposed on the organic insulating layer to be in contact with a second end of the micro light-emitting element, exposed by the first passivation layer.

According to some embodiments of the present disclosure, a display device comprises a substrate, a circuit element layer disposed on the substrate and including a first transistor, a power line, which extends in a first direction, and a capacitor, which is directly connected to the first transistor and the power line and is disposed to overlap with the power line and a display element layer disposed on the circuit element layer and including a first pixel electrode, which is electrically connected to the first transistor, a second pixel electrode, which is spaced apart from the first pixel electrode and is electrically connected to the power line, and a micro light-emitting element, which is disposed between the first and second pixel electrodes.

The circuit element layer may further include a first electrode pattern, the first electrode pattern overlaps with the first transistor and is electrically connected to the transistor, the first electrode pattern extends in a second direction that is perpendicular to the first direction, to overlap with, and be insulated from, the power line, and the capacitor is formed in an overlapping area of the power line and the first electrode pattern.

Part of the first electrode pattern that overlaps with the power line may form a first electrode of the capacitor, and part of the power line that overlaps with the first electrode pattern may form a second electrode of the capacitor.

The circuit element layer may include a first scan line, which extends in the second direction and is connected to a gate electrode of the first transistor, a second scan line, which is spaced apart from the first scan line and extends in the second direction, an initialization voltage line, which extends in the second direction, between the first and second scan lines, a first electrode, which is electrically connected to the first pixel electrode, a second electrode, which is electrically connected to the initialization voltage line, and a second transistor, which includes a gate electrode that is connected to the second scan line, and the capacitor is located between the first scan line and the initialization voltage line in a plan view.

A plurality of insulating layers may be interposed between the first and second electrodes of the capacitor.

According to some embodiments of the present disclosure, a display device comprises a first power voltage line, a second power voltage line, a data line, a first scan line, a first transistor including a first electrode, which is electrically connected to the data line, a second electrode, which is electrically connected to a first node, and a gate electrode, which is electrically connected to the first scan line, a first capacitor connected between the first node and the first power voltage line, a second transistor including a first electrode, which is electrically connected to the first power voltage line, a second electrode, which is electrically connected to a second node, and a gate electrode, which is electrically connected to the first node, a light-emitting element electrically connected between the second node and the second power voltage line and a second capacitor electrically connected between the second node and the second power voltage line.

The above and other features and advantages of the present disclosure will become more apparent by describing in detail exemplary embodiments thereof with reference to the attached drawings.

Advantageous Effects

According to embodiments of the present disclosure, a display device includes auxiliary capacitors connected in parallel to light-emitting elements. Thus, node voltages of first electrodes of the light-emitting elements can be prevented from varying due to neighboring nodes, and the light-emitting elements in the display device can stably emit light at a desired luminance.

The effects according to the embodiments of the present disclosure are not limited by those mentioned above, and various other effects are included in the present specification.

BEST MODES FOR CARRYING OUT THE PRESENT DISCLOSURE

The present disclosure will now be described more fully hereinafter with reference to the accompanying drawings, in which some embodiments of the disclosure are shown. This disclosed embodiments may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments of the present disclosure will be described with reference to the attached drawings.

Figure 1:
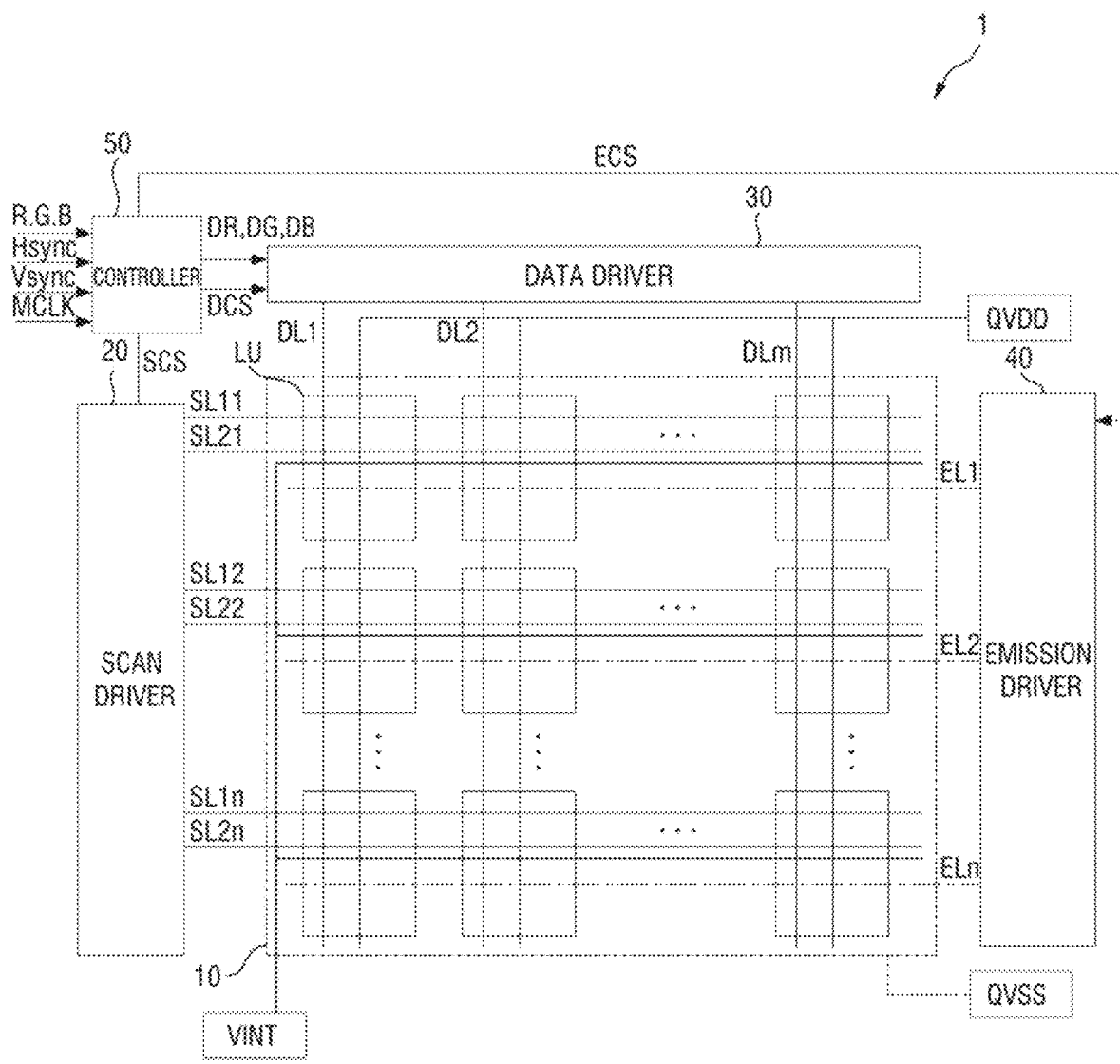
FIG. 1 is a block diagram of a display device according to some embodiments.

FIG. 1 is a block diagram of a display device according to some embodiments.

Referring to FIG. 1, a display device 1 may include a display unit 10, which includes light-emitting units LU, a scan driver 20, a data driver 30, an emission driver 40, and a controller 50.

The display device 1 (or the display unit 10) may include scan lines (SL11 through SL1$n$ and SL21 through SL2$n$ where n is an integer of 2 or greater), data lines (DL1 through DLm where m is an integer of 2 or greater), and emission control lines (EL1 through ELn), and the light-emitting units LU may be disposed at the crossing regions of the scan lines (SL11 through SL1$n$ and SL21 through SL2$n$), the data lines (DL1 through DLm), and the emission control lines (EL1 through ELn). Here, the light-emitting units LU (or pixels) may be minimal units for displaying an image or a color. The light-emitting units LU will be described later with reference to FIG. 2.

The scan lines (SL11 through SL1$n$ and SL21 through SL2$n$) may extend substantially in a row direction (or a first direction or a left-to-right direction). The emission control lines (EL1 through ELn) may extend substantially in the row direction. The data lines (DL1 through DLm) may extend substantially in a column direction (or a second direction or a top-to-bottom direction). Here, the row and column directions may be interchangeable.

The display device 1 may further include an initialization voltage line (or an initialization voltage supply line), a first power voltage line (or a first power voltage supply line), and a second power voltage line (or a second power voltage supply line).

The initialization voltage line, which is a line that provides an initialization voltage VINT to the light-emitting units LU, may branch off into rows and may then extend in the row direction. The first power voltage line, which is a line that provides a first power voltage QVDD to the light-emitting units LU, may branch off into columns and may then extend in the column direction. The second power voltage line, which is a line that provides a second power voltage QVSS (or a common voltage) that is different from the first power voltage QVDD, may be arranged in a mesh form. However, the present disclosure is not limited to this, and the directions in which the initialization voltage line and the first power voltage line extend may vary.

Each of the light-emitting units LU may be connected to two scan lines, one data line, one emission control line, one initialization voltage line, and one first power voltage line. For example, a light-emitting element LU (hereinafter, the 11$^{th}$ light-emitting unit) in a first row (or a first pixel row) and a first column (or a first pixel column) may be connected to 11$^{th}$ and 21$^{st}$ scan lines SL11 and SL21, a first data line DL1, a first emission control line EL1, one initialization voltage line, and one first power voltage line.

The scan driver 20 may generate first and second scan signals and may provide the first and second scan signals to the light-emitting units LU via the scan lines (SL11 through SL1$n$ and SL21 through SL2$n$). The first and second scan signals will be described later with reference to FIG. 2.

The data driver 30 may provide data signals to the light-emitting units LU via the data lines (DL1 through DLm). For example, in a case where a first scan signal is provided to the light-emitting unit LU (i.e., the 11$^{th}$ light-emitting unit) in the first row and the first column via a first scan line SL1, a data signal may be provided to the 11th light-emitting unit.

The emission driver 40 may generate an emission control signal and may provide the emission control signal to the light-emitting units LU via the emission control lines (EL1 through ELn). The emission driver 40 (or the display device 1) may control the emission duration of the light-emitting units LU based on the emission control signal. The emission driver 40 is illustrated as being independent and separate from the scan driver 20, but the present disclosure is not limited thereto. For example, the emission driver 40 may be included in, and integrally formed with, the scan driver 20. In another example, the emission driver 40 may not be provided depending on the circuit configuration of the light-emitting units LU.

The controller 50 may convert image signals (R, G, and B) received from the outside (or an external device such as an application processor) into image data signals (DR, DG, and DB) and may transmit the image data signals (DR, DG, and DB) to the data driver 30. Also, the controller 50 may receive a vertical synchronization signal Vsync, a horizontal synchronization signal Hsync, and a clock signal MCLK, may generate control signals for controlling operations (or the driving) of the scan driver 20, the data driver 30, and the emission driver 40, and may provide the control signals to the scan driver 20, the data driver 30, and the emission driver 40. Here, the control signals may include a scan driving control signal SCS, which controls the scan driver 20, a data driving control signal DCS, which controls the data driver 30, and an emission driving control signal ECS, which controls the emission driver 40.

The display device 1 may further include a power supply (not illustrated), and the power supply may generate the first power voltage QVDD, the second power voltage QVSS, and the initialization voltage VINT, and may provide the first power voltage QVDD, the second power voltage QVSS, and the initialization voltage VINT to the light-emitting units LU via the first power voltage line, the second power voltage line, and the initialization voltage line, respectively. The first power voltage QVDD may be a predetermined high-level voltage, the second power voltage QVSS may be a predetermined low-level voltage, and the second power voltage QVSS may be lower than the first power voltage QVDD. The power supply may be implemented as an external voltage source.

The light-emitting units LU may emit light at a predetermined luminance based on driving currents applied thereto in accordance with data signals input thereto via the data lines (DL1 through DLm).

Figure 2:
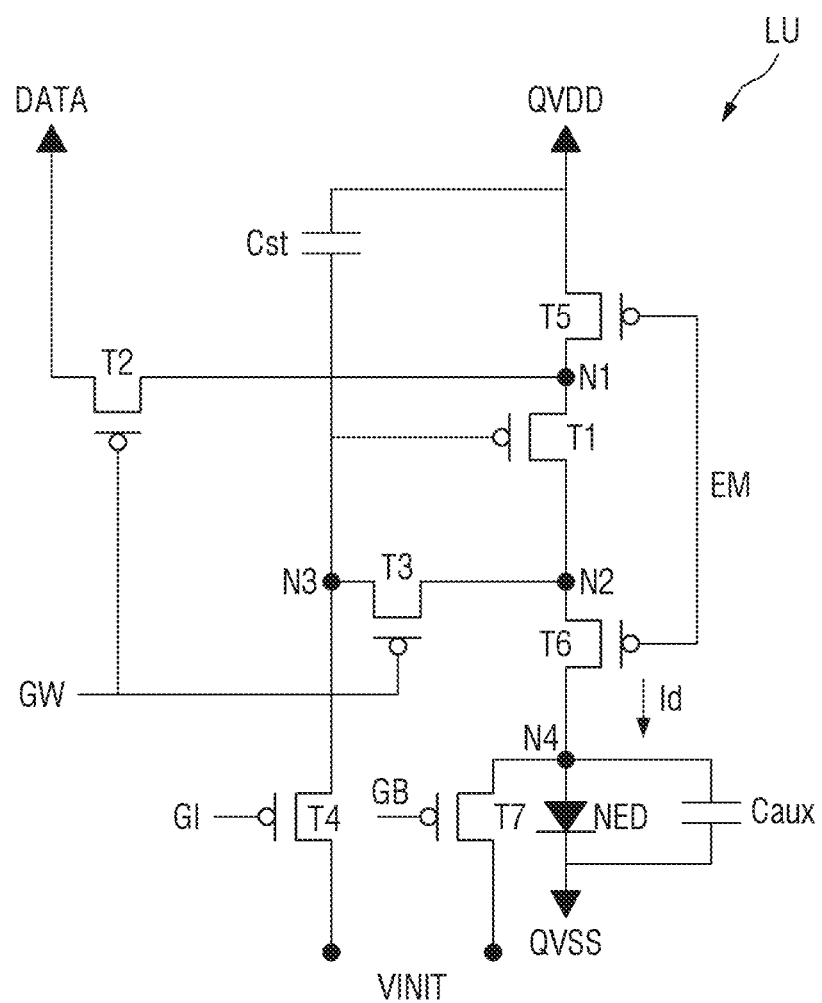
FIG. 2 is a circuit diagram of a light-emitting unit included in the display device of FIG. 1.

FIG. 2 is a circuit diagram of a light-emitting unit included in the display device of FIG. 1.

Referring to FIG. 2, a light-emitting unit LU may include a micro light-emitting element NED, first through seventh transistors T1 through T7, a capacitor Cst (or a sustain capacitor or a storage capacitor), and an auxiliary capacitor Caux. Here, the micro light-emitting element NED may be an inorganic light-emitting element and may include a plurality of micro light-emitting elements. The micro light-emitting element NED will be described later with reference to FIGS. 8 through 11.

A data signal DATA, a first scan signal GW, a second scan signal GI, a third scan signal GB, and an emission control signal EM may be provided to the light-emitting unit LU. Here, the second scan signal GI may be a first scan signal GW of a previous time or a previous row. For example, a second scan signal GI[n] provided to an n-th row of light-emitting units LU may be the same as a first scan signal GW[n−1] provided to an (n−1)-th row of light-emitting units LU. Similarly, the third scan signal GB may be the same as a second scan signal GI of a subsequent time or a subsequent row. For example, a third scan signal GB[n] provided to the n-th row of light-emitting units LU may be the same as a first scan signal GW[n+1] provided to an (n+1)-th row of light-emitting units LU.

Each of the first through seventh transistors T1 through T7 may include a first electrode, a second electrode, and a gate electrode. One of the first and second electrodes is a source electrode, and the other electrode is a drain electrode.

The first through seventh transistors T1 through T7 may be thin-film transistors (TFTs). The first through seventh transistors T1 through T7 may be PMOS transistors or NMOS transistors. The first through seventh transistors T1 through T7 will hereinafter be described as being, for example, PMOS transistors.

The micro light-emitting element NED may include an anode electrode and a cathode electrode. The anode electrode of the micro light-emitting element NED may be connected to a fourth node N4, and the cathode electrode of the micro light-emitting element NED may be connected to a second power voltage line (i.e., a line that provides the second power voltage QVSS). The micro light-emitting element NED may include a plurality of micro light-emitting elements disposed between the anode electrode and the cathode electrode, and this will be described later with reference to FIG. 8.

The auxiliary capacitor Caux may be connected in parallel to the micro light-emitting element NED. For example, the auxiliary capacitor Caux may include first and second electrodes, the first electrode may be electrically connected to a first pixel electrode of the micro light-emitting element NED, and the second electrode may be electrically connected to a second pixel electrode of the micro light-emitting element NED. The auxiliary capacitor Caux can alleviate the variation of the voltage of the anode electrode of the micro light-emitting element NED (i.e., the voltage of the fourth node N4) by the operation of the sixth transistor T6, which will be described later, and can allow the micro light-emitting element NED to stably emit light in accordance with the voltage of the first pixel electrode that is relatively stabilized.

In some embodiments, the capacitance of the auxiliary capacitor Caux may be 0.1 picofarads (pF) or greater (e.g., 0.1 pF to 1 pF, 0.1 pF to 0.5 pF, or 0.1 pF to 0.3 pF). As the capacitance of the auxiliary capacitor Caux increases, the stability of the voltage of the first pixel electrode increases. On the contrary, as the capacitance of the auxiliary capacitor Caux decreases, the amount of initialization time for initializing the auxiliary capacitor Caux may decrease. Thus, the auxiliary capacitor Caux may have a predetermined range of capacitances (e.g., 0.1 pF to 0.3 pF).

In some embodiments, the sum of the capacitance of the auxiliary capacitor Caux and the parasitic capacitance of the micro light-emitting element NED may be uniform. For example, the sum of the capacitance of the auxiliary capacitor Caux and the parasitic capacitance of the micro light-emitting element NED may be 0.1 pF to 1 pF, 0.1 pF to 0.5 pF, or 0.1 pF to 0.3 pF. Thus, as the parasitic capacitance of the micro light-emitting element NED increases, the capacitance of the auxiliary capacitor Caux may decrease.

For example, the sum of the capacitance of the auxiliary capacitor Caux and the parasitic capacitance of the micro light-emitting element NED may be 0.11 pF, and the capacitance of micro light-emitting elements (or fine inorganic light-emitting elements) included in the micro light-emitting element NED may be 0.5 fF. In a case where the micro light-emitting element NED includes 20 micro light-emitting elements, the capacitance of the micro light-emitting element NED may be 10 fF, and the capacitance of the auxiliary capacitor Caux may be 100 fF. In another example, in a case where the micro light-emitting element NED includes 50 micro light-emitting elements, the capacitance of the micro light-emitting element NED may be 25 fF, and the capacitance of the auxiliary capacitor Caux may be 85 fF.

Referring again to FIG. 2, the first transistor T1 (or a driving transistor) may include a first electrode connected to a first node N1, a second electrode connected to a second node N2, and a gate electrode connected to a third node N3. The first transistor T1 may provide a driving current to the micro light-emitting element NED based on the voltage of the third node N3 (or a data voltage stored in the capacitor Cst that will be described later).

The second transistor T2 (or a switching transistor) may include a first electrode connected to a data line (for receiving data), a second electrode connected to the first node N1, and a gate electrode connected to a first scan line (e.g., the first scan line SL1 of FIG. 1) for receiving the first scan signal GW. The second transistor T2 may be turned on in response to the first scan signal GW and may transmit the data signal DATA to the first node N1.

The third transistor T3 may include a first electrode connected to the second node N2, a second electrode connected to the third node N3, and a gate electrode connected to the first scan line for receiving the first scan signal GW. The third transistor T3 may be turned on in response to the first scan signal GW and may transmit the data signal DATA to the third node N3.

The capacitor Cst may be connected between the third node N3 and the first power voltage QVDD. The capacitor Cst may store or sustain the data signal DATA provided thereto.

The fourth transistor T4 may include a first electrode connected to the third node N3, a second electrode connected to the initialization voltage line for receiving the initialization voltage VINT, and a gate electrode connected to a second scan line (e.g., a second scan line SL21 of FIG. 1) for receiving the second scan signal GI.

The fourth transistor T4 may be turned on in response to the second scan signal GI before the storing of the data signal DATA in the capacitor Cst, and may initialize the third node N3 (or the capacitor Cst) with the initialization voltage VINT.

In some embodiments, each of the third and fourth transistors T3 and T4 may be implemented as a dual transistor (i.e., a type of transistor into which two transistors are combined). In this case, any leakage currents in the third and fourth transistors T3 and T4 and the resulting degradation of display quality can be prevented or alleviated.

The fifth and sixth transistors T5 and T6 (or first and second emission control transistors) may be connected between the first power voltage line and the micro light-emitting element NED and may form a current moving path along which the driving current Id generated by the first transistor T1 can move.

The fifth transistor T5 may include a first electrode connected to the first power voltage line to receive the first power voltage QVDD, a second electrode connected to the first node N1, and a gate electrode connected to an emission control signal line (e.g., the first emission control signal line EL1 of FIG. 1) for receiving the emission control signal EM.

Similarly, the sixth transistor T6 may include a first electrode connected to the second node N2, a second electrode connected to the fourth node (or the anode electrode of the micro light-emitting element NED), and a gate electrode connected to the emission control signal line (e.g., the first emission control signal line EL1 of FIG. 1) for receiving the emission control signal EM).

The fifth and sixth transistors T5 and T6 may be turned on in response to the emission control signal EM. In this case, the driving current Id may be provided to the micro light-emitting element NED, and the micro light-emitting element NED may emit light at a luminance corresponding to the driving current ID.

The seventh transistor T7 may include a first electrode connected to the fourth node N4, a second electrode connected to the initialization voltage line (or the initialization voltage VINT), and a gate electrode connected to the second scan signal line (e.g., the second scan signal line SL21 of FIG. 1) for receiving the third scan signal GB.

The seventh transistor T7 may be turned on in response to the third scan signal GB before or after the emission of light by the micro light-emitting element NED, and may initialize the anode electrode of the micro light-emitting element NED with the initialization voltage VINT. The auxiliary capacitor Caux, which is connected in parallel to the micro light-emitting element NED, and the parasitic capacitor of the micro light-emitting element NED may be charged or discharged by the driving current Id during the emission of light by the micro light-emitting element NED so that the anode electrode of the micro light-emitting element NED may have a non-uniform voltage. Thus, the parasitic capacitor of the micro light-emitting element NED and the auxiliary capacitor Caux may be initialized with the seventh transistor T7.

As described above with reference to FIG. 2, the light-emitting unit LU includes the auxiliary capacitor Caux, which is connected in parallel to the micro light-emitting element NED. Thus, even when the sixth transistor T6, which is connected to one end of the micro light-emitting element NED, is turned on, the voltage of the anode electrode of the micro light-emitting element NED can be uniformly maintained, and the light-emitting unit LU can emit light at the luminance corresponding to the driving current Id without consideration of variations in the voltage of the anode electrode of the micro light-emitting element NED.

FIG. 2 illustrates that the seventh transistor T7 receives the third scan signal GB, but the present disclosure is not limited thereto. For example, the seventh transistor T7 may receive the second scan signal GI.

The structures of the display device 1 and the auxiliary capacitor Caux will hereinafter be described with reference to the layout view and the cross-sectional view of the display device 1.

Figure 3:
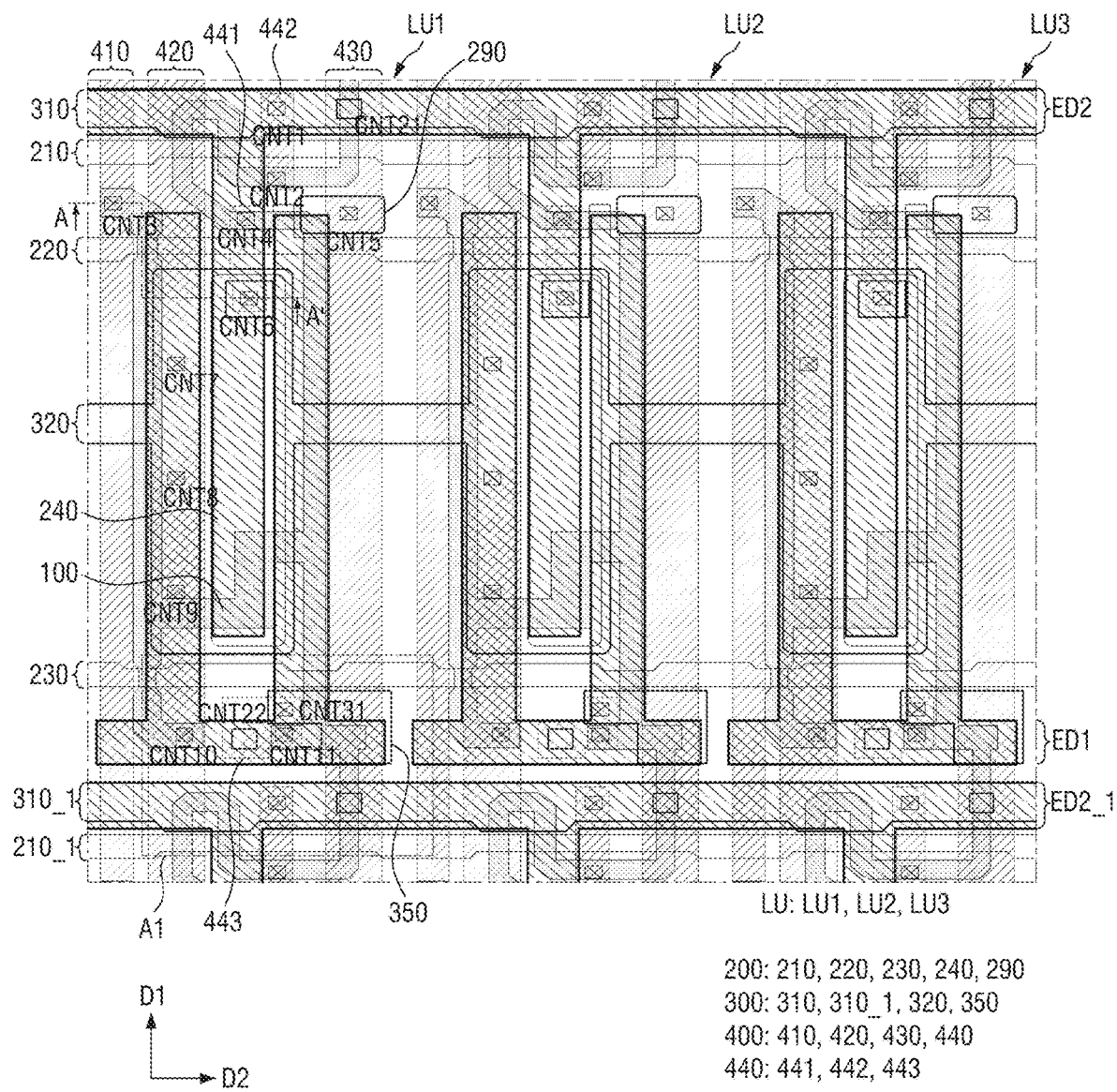
FIG. 3 is a layout view of an example of the display device of FIG. 1.
Figure 4:
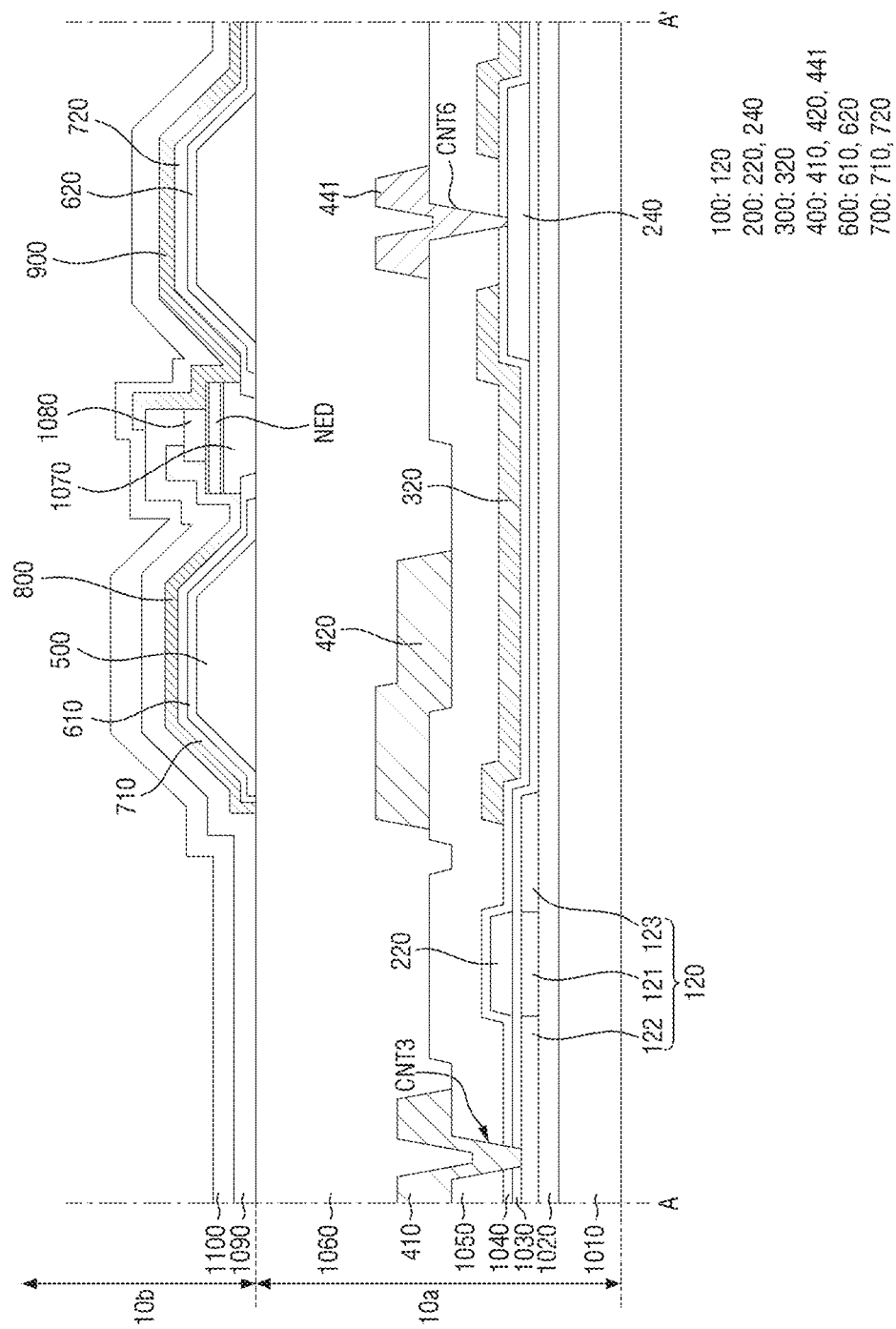
FIG. 4 is a cross-sectional view taken along line A-A' of FIG. 3.

FIG. 3 is a layout view of an example of the display device of FIG. 1. FIG. 4 is a cross-sectional view taken along line A-A' of FIG. 3.

In the following description of the embodiments of FIGS. 3 and 4, some elements will be referred to by different reference numerals from their respective counterparts of FIGS. 1 and 2 for clarity and for the ease of explanation of the arrangement and the coupling relationships therebetween.

Referring to FIGS. 3 and 4, the display device 1 may include a circuit element layer 10a and a display element layer 10b. The circuit element layer 10a may include the first through seventh transistors T1 through T7, the capacitor Cst, and the auxiliary capacitor Caux of FIG. 2, and the display element layer 10b may include the micro light-emitting element NED. As illustrated in FIG. 3, light-emitting units (LU1 through LU3) have the same layout and thus will hereinafter be described, taking a first light-emitting unit LU1 as an example.

As illustrated in FIGS. 3 and 4, the circuit element layer 10a may include a substrate 1010, a buffer layer 1020, a semiconductor layer 100, a first insulating layer 1030, a first conductive layer 200, a second insulating layer 1040, a second conductive layer 300, a third insulating layer 1050, a third conductive layer 400, and a fourth insulating layer 1060.

The display element layer 10b may include a barrier wall 500, a reflective layer 600, an electrode layer 700 (or a pixel electrode layer), a fifth insulating layer 1070, the micro light-emitting element NED, a sixth insulating layer 1080, a first contact electrode 800, a seventh insulating layer 1090, a second contact electrode 900, and an eighth insulating layer 1100. The reflective layer 600 and the electrode layer 700 may form first and second pixel electrodes ED1 and ED2 of the micro light-emitting element NED.

The aforementioned layers may be formed as single films or as stacks of multiple films. There may exist intervening layers between the aforementioned layers.

Figure 5:
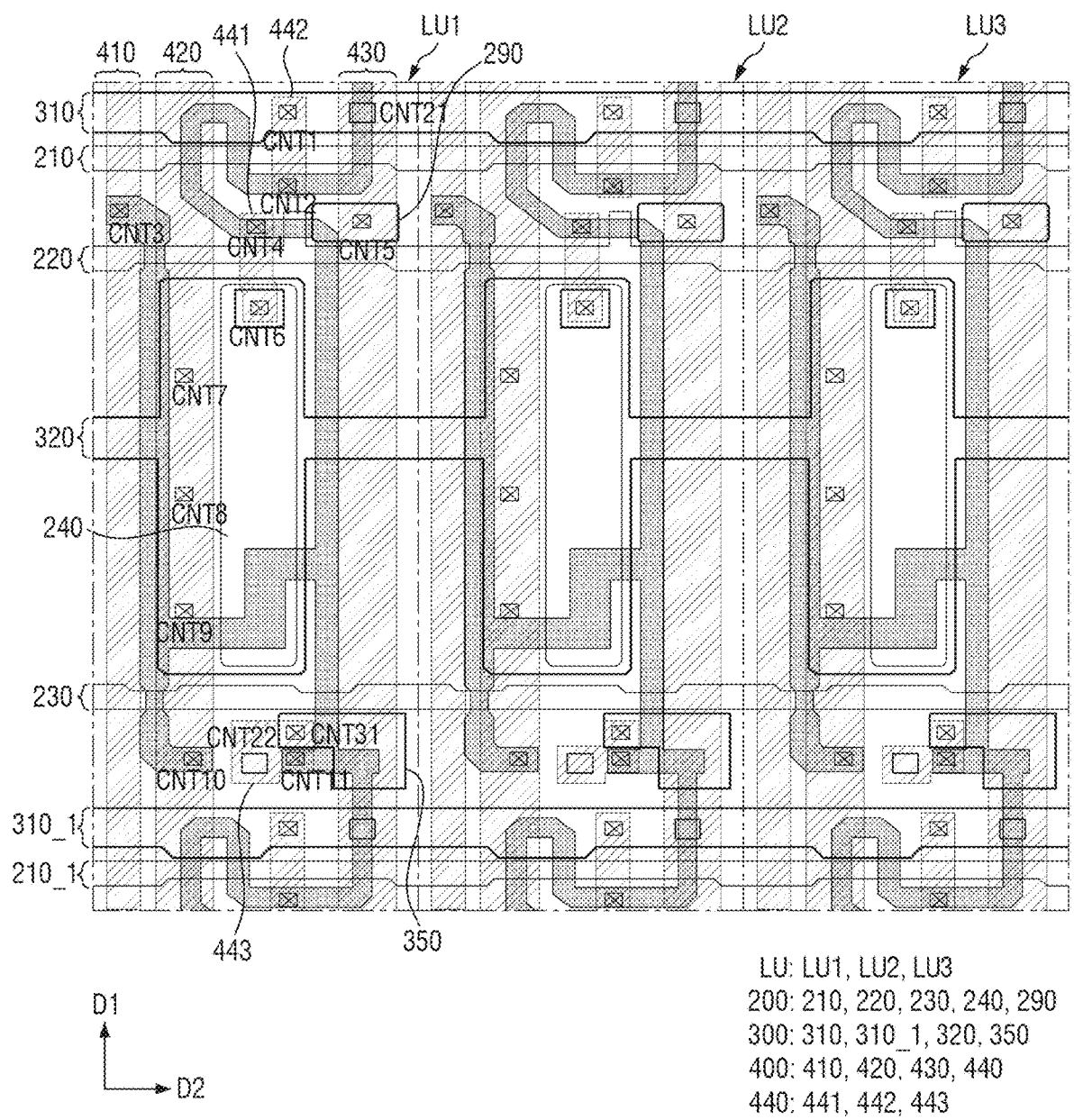
FIG. 5 is a layout view of a circuit element layer included in the display device of FIG. 3.

FIG. 5 is a layout view of a circuit element layer included in the display device of FIG. 3. FIG. 5 illustrates only the circuit element layer 10a of the display device of FIG. 3, and not the display element layer 10b. The circuit element layer 10a will hereinafter be described with reference to FIGS. 4 and 5, and then, the display element layer 10*b* will be described with reference to FIGS. 4 and 8.

As illustrated in FIG. 4, a substrate 1010 (or a base layer) supports the layers disposed thereabove. In a case where the display device 1 is of a bottom or double-sided emission type, a transparent substrate may be used. In a case where the display device 1 is of a top emission type, not only a transparent substrate, but also a semitransparent or opaque substrate may be used.

The substrate 1010 may be formed of an insulating material such as glass, quartz, or a polymer resin. Examples of the polymer material include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and a combination thereof. The substrate 1010 may include a metallic material.

The substrate 1010 may be a rigid substrate or a flexible substrate that is bendable, foldable, or rollable. The flexible substrate may include PI, but the present disclosure is not limited thereto.

A buffer layer 1020 may be disposed on the entire surface of the substrate 1010. The buffer layer 1020 may prevent the diffusion of impurity ions and the penetration of moisture or external air and may perform a surface planarization function. The buffer layer 1020 may include silicon nitride, silicon oxide, or silicon oxynitride. The buffer layer 1020 may not be provided depending on the type of the substrate 1010 or processing conditions.

The semiconductor layer 100 (or an active layer) may include the channel regions, source regions, and drain regions of the first through seventh transistors T1 through T7. The semiconductor layer 100 may be separated between the light-emitting units, but the present disclosure is not limited thereto. As illustrated in FIG. 3, the light-emitting units arranged in a first direction D1 (or the column direction) may share the semiconductor layer 100 together.

The semiconductor layer 100 will hereinafter be described with reference to FIGS. 6 and 7.

Figure 6:
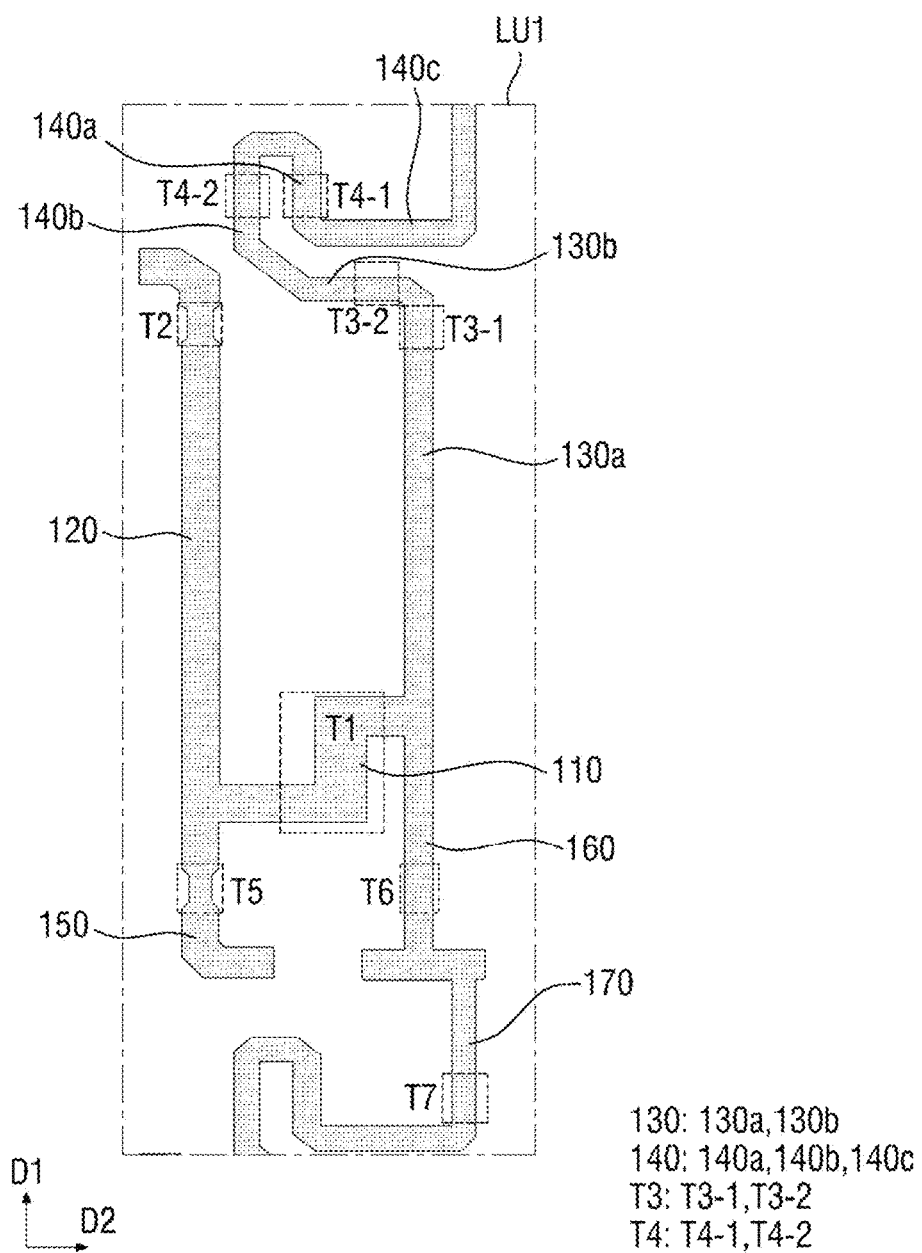
FIG. 6 is a plan view of a semiconductor layer included in the circuit element layer of FIG. 5.

FIG. 6 is a plan view of a semiconductor layer included in the circuit element layer of FIG. 5. FIG. 7 is a layout view of an example of the circuit element layer of FIG. 5.

Referring to FIG. 6, the semiconductor layer 100 may include a horizontal portion that extends in a second direction D2, a first vertical portion (or a left vertical portion) and a second vertical portion (or a right vertical portion) that extend in the first direction D1, and curved portions.

The horizontal portion may include a first semiconductor region 110, which connects the middle of the first vertical portion and the middle of the second vertical portion. The first semiconductor region 110 may connect the first and second vertical portions with the shortest distance. Alternatively, as illustrated in FIG. 6, the first semiconductor region 110 may include left and right bent portions. The total length of the first semiconductor region 110 may be increased by bending the first semiconductor region 110 more than one time. A channel 111 of the first transistor T1 may be disposed or formed in the first semiconductor region 110.

The first vertical portion may be disposed adjacent to the left side of a light-emitting unit LU (or a pixel where the light-emitting unit LU is disposed), and the second vertical portion may be disposed adjacent to the right side of the light-emitting unit LU. The first and second vertical portions may be disposed to be spaced apart from each other.

The first vertical portion may include a second semiconductor region 120, which is disposed above the first semiconductor region 110, and a fifth semiconductor region 150, which is disposed below the first semiconductor region 110. The second vertical portion may include a $31^{st}$ semiconductor region 130*a* (or a "3-1"-th semiconductor region), which is disposed above the first semiconductor region 110, and sixth and seventh semiconductor regions 160 and 170, which are disposed below the first semiconductor region 110.

The curved portions may include a $32^{nd}$ semiconductor region 130*b* (or a "3-2"-th semiconductor region), which extends from the second vertical portion in a leftward direction, a $42^{nd}$ semiconductor region 140*b* (or a (4-2)-th semiconductor region), which is bent and extends from the $32^{nd}$ semiconductor region 130*b* in an upward direction, and a $41^{st}$ semiconductor region 140*a* (or a "4-1"-th semiconductor region), which is bent and extends in a rightward direction and a downward direction, and may be connected to the second vertical portion (or a second vertical portion in a previous pixel area or a seventh semiconductor region 170).

The $31^{st}$ semiconductor region 130*a* and the $32^{nd}$ semiconductor region 130*b* may be included in a third semiconductor region 130, and the $41^{th}$ semiconductor region 140*a* and the $42^{nd}$ semiconductor region 140*b* may be included in a fourth semiconductor region 140. Similarly, a $31^{st}$ transistor T3_1 and a $32^{nd}$ transistor T3_2 may be included in the third transistor T3, and a $41^{st}$ transistor T4_1 and a $42^{nd}$ transistor T4_2 may be included in the fourth transistor T4.

The semiconductor layer 100 may include polycrystalline silicon, which may be formed by crystallizing amorphous silicon. Examples of a crystallization method include rapid thermal annealing (RTA), solid phase crystallization (SPC), excimer laser annealing (ELA), metal induced crystallization (MIC), metal induced lateral crystallization (MILC), and sequential lateral solidification (SLS), but the present disclosure is not limited thereto. Alternatively, the semiconductor layer 100 may include monocrystalline silicon, low-temperature polycrystalline silicon, or amorphous silicon.

Parts (or electrode regions or source/drain regions) of the semiconductor layer 100 connected to the source/drain electrodes of the first through seventh transistors T1 through T7 may be doped with impurity ions. For example, p- or n-type impurity ions may be used.

Referring again to FIG. 4, the first insulating layer 1030 may be disposed on the semiconductor layer 100, on substantially the entire surface of the substrate 1010. The first insulating layer 1030 may be a gate insulating film.

The first insulating layer 1030 may include a silicon compound or a metal oxide. For example, the first insulating layer 1030 may include silicon oxide, silicon nitride, silicon oxynitride, aluminum oxide, tantalum oxide, hafnium oxide, zirconium oxide, and titanium oxide. These materials may be used alone or in combination with one another. The first insulating layer 1030 may be a single-layer film or a multilayer film consisting of a stack of different materials.

The first insulating layer 1030 may have a thickness of 1000 Å to 2000 Å or 1200 Å to 1500 Å, for example, about 1300 Å.

The first conductive layer 200 is disposed on the first insulating layer 1030.

As illustrated in FIG. 5, the first conductive layer 200 may include a first scan line 210, a second scan line 220, an emission control line 230 (or a fourth scan line), and a first gate electrode 240. Also, the first conductive layer 200 may include a first dummy pattern 290.

The first scan line 210 may transmit the second scan signal GI. The first scan line 210 may extend in the second direction D2 to extend beyond the boundaries of the light-emitting unit LU into the neighboring light-emitting units. The first scan line 210 may be disposed above the light-emitting unit LU in a plan view.

The second scan line 220 may transmit the first scan signal GW. The second scan line 220 may extend in the second direction D2 to extend beyond the boundaries of the light-emitting unit LU into the neighboring light-emitting units. The first scan line 210 may be disposed in the middle of the light-emitting unit LU (or an area of the light-emitting unit LU where micro light-emitting elements that will be described later are disposed) in a plan view. The second scan line 220 may overlap with the second and third semiconductor regions 120 and 130. As illustrated in FIGS. 5 and 7, the second scan line 220 may include a protruding portion that is formed to protrude in the first direction D1, and the protruding portion may overlap with the $32^{nd}$ semiconductor region 130b.

The emission control line 230 (or the fourth scan line) may transmit the emission control signal EM. The emission control line 230 may extend in the second direction D2 to extend beyond the boundaries of the light-emitting unit LU into the neighboring light-emitting units. The emission control line 230 may be disposed below the light-emitting unit LU in a plan view. The emission control line 230 may overlap with the fifth and sixth semiconductor regions 150 and 160.

The first gate electrode 240, which is a gate electrode of the first transistor T1, may be located in the middle of the light-emitting unit LU. The first gate electrode 240 may be disposed between the second scan line 220 and the emission control line 230 in a plan view. The first gate electrode 240 may be separated between light-emitting units LU and may be disposed as an island. The first gate electrode 240 may overlap with the first semiconductor region 110.

The first dummy pattern 290 may overlap with the third semiconductor region 130. In the plan view of FIG. 6, the first dummy pattern 290 may be located between the $31^{st}$ and $32^{nd}$ semiconductor regions 130a and 130b and may receive the second power voltage QVSS to alleviate or prevent the variation of the voltage of the node between the $31^{st}$ and $32^{nd}$ transistors T3-1 and T3-2.

The first conductive layer 200 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 200 may be a single- or multilayer film.

The gate electrode and the first and second electrode regions (or the source and drain regions) of each of transistors (T1 through T7) are determined by the overlapping area of the first conductive layer 200 and the semiconductor layer 100, and this will hereinafter be described with reference to FIG. 7.

Figure 7:
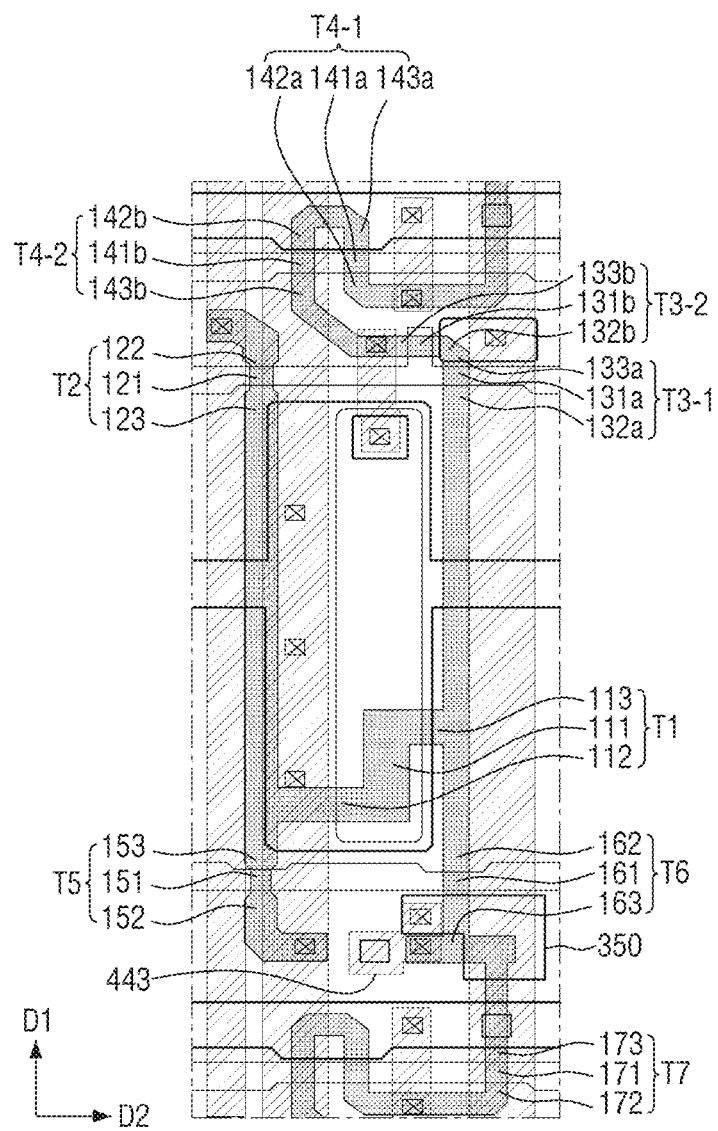
FIG. 7 is a layout view of an example of the circuit element layer of FIG. 5.

FIG. 7 is a layout view of an example of the circuit element layer of FIG. 5.

As illustrated in FIGS. 5 through 7, the first scan line 210 may overlap with the fourth semiconductor region 140, and in a $41^{st}$ overlapping area where the first scan line 210 and the $41^{st}$ semiconductor region 140a overlap, a gate electrode 141a of the $41^{st}$ transistor T4_1 may be formed, and in a $42^{nd}$ overlapping area where the first scan line 210 and the $41^{st}$ semiconductor region 140b overlap, a gate electrode 141b of the $42^{nd}$ transistor T4_2 may be formed. A part 142a of the $41^{st}$ semiconductor region 140a, which is disposed below the $41^{st}$ overlapping area, may become a first electrode region of the $41^{st}$ transistor T4_1 (or a region where the first electrode of the $41^{st}$ transistor T4_1 is formed), and a part 143a of the $41^{st}$ semiconductor region 140a, which is disposed above the $41^{st}$ overlapping area, may become a second electrode region of the $41^{st}$ transistor T4_1. Similarly, a part 142b of the $42^{nd}$ semiconductor region 140b, which is disposed above the $42^{nd}$ overlapping area, may become a first electrode region of the $42^{nd}$ transistor T4_2, and a part 143b of the $42^{nd}$ semiconductor region 140b, which is disposed below the $42^{nd}$ overlapping area, may become a second electrode region of the $42^{nd}$ transistor T4_2.

Also, the first scan line 210 (or a first scan line 210_1) may overlap with the seventh semiconductor region 170, in a seventh overlapping area where the first scan line 210 and the seventh semiconductor region 170 overlap, a gate electrode 171 of the seventh transistor T7 may be formed, a part 172 of the seventh semiconductor region 170, which is disposed below the seventh overlapping area, may become a first electrode region of the seventh transistor T7, and a part 173 of the seventh semiconductor region 170, which is disposed above the seventh overlapping area, may become a second electrode region of the seventh transistor T7.

In a second overlapping area where the second scan line 220 and the second semiconductor region 120 overlap, a gate electrode 121 of the second transistor T2 may be formed, a part 122 of the second semiconductor region 120, which is disposed above the second overlapping area, may become a first electrode region of the second transistor T2, and a part 123 of the second semiconductor region 120, which is disposed below the second overlapping area, may become a second electrode region of the second transistor T2.

In a $32^{nd}$ overlapping area where the second scan line 220 and the $32^{nd}$ semiconductor region 130b overlap, a gate electrode 131b of the $32^{nd}$ transistor T3_2 may be formed. A part 132b of the $32^{nd}$ semiconductor region 130b, which is disposed on the right side of the $32^{nd}$ overlapping area, may become a first electrode region of the $32^{nd}$ transistor T3_2, and a part 133b of the $32^{nd}$ semiconductor region 130b, which is disposed on the left side of the $32^{nd}$ overlapping area, may become a second electrode region of the $32^{nd}$ transistor T3_2.

In a 31st overlapping area where the second scan line 220 and the 31st semiconductor region 130a overlap, a gate electrode 131a of the 31st transistor T3_1 may be formed. A part 132a of the 31st semiconductor region 130a, which is disposed below the 31st overlapping area, may become a first electrode region of the 31st transistor T3_1, and a part 133a of the 31st semiconductor region 130a, which is disposed above the 31st overlapping area, may become the second electrode region of the 31st transistor T3_1.

In a fifth overlapping area where the emission control line 230 and the fifth semiconductor region 150 overlap, a gate electrode 151 of the fifth transistor T5 may be formed, a part 152 of the fifth semiconductor region 150, which is disposed below the fifth overlapping area, may become a first electrode region of the fifth transistor T5, and a part 153 of the fifth semiconductor region 150, which is disposed above the fifth overlapping area, may become a second electrode region of the fifth transistor T5.

Similarly, in a sixth overlapping area where the emission control line 230 and the sixth semiconductor region 160 overlap, a gate electrode 161 of the sixth transistor T6 may be formed, a part 162 of the sixth semiconductor region 160, which is disposed above the sixth overlapping area, may become a first electrode region of the sixth transistor T6, and a part 163 of the sixth semiconductor region 160, which is disposed below the sixth overlapping area, may become a second electrode region of the sixth transistor T6.

A part 112 of the first semiconductor region 110, which is disposed on the left side of a first overlapping area where the first gate electrode 240 and the first semiconductor region 110 overlap, may become a first electrode region of the first transistor T1, and a part 113 of the first semiconductor region 110, which is disposed on the right side of the first overlapping area, may become a second electrode region of the first transistor T1.

Referring again to FIG. 4, the second insulating layer 1040 (or an interlayer insulating layer) may be disposed on the first conductive layer 200, on substantially on the entire surface of the substrate 1010. The second insulating layer 1040 may insulate the first and second conductive layers 200 and 300 and may be an interlayer insulating film.

The second insulating layer 1040 may include an inorganic insulating material such as silicon oxide, silicon nitride, silicon oxynitride, hafnium oxide, aluminum oxide, titanium oxide, tantalum oxide, or zinc oxide or an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB). The second insulating layer 1040 may be a single-layer film or a multilayer film consisting of a stack of different materials.

The second insulating layer 1040 may have a thickness of 1500 Å to 3000 Å or 2000 Å to 2500 Å.

The second conductive layer 300 is disposed on the second insulating layer 1040.

As illustrated in FIG. 5, the second conductive layer 300 may include an initialization voltage line 310, which transmits the initialization voltage VINT, a first electrode 320 (or an electrode line) of the capacitor (Cst), and a first electrode pattern 350 of the capacitor Cst (or a first electrode pattern 350 of the auxiliary capacitor Caux).

The initialization voltage line 310 may be disposed between the first scan line 210 and a neighboring first scan line 210 (or the first scan line 210_1) in a plan view and may extend in the second direction D2 to extend beyond the boundaries of the light-emitting unit LU into the neighboring light-emitting units.

The first electrode 320 of the capacitor Cst may be located between the second scan line 220 and the emission control line 230 across the middle of the light-emitting unit LU. The first electrode 320 of the capacitor Cst may be disposed to overlap with the first gate electrode 240 with the second insulating layer 1040 interposed therebetween. The first gate electrode 240 may become the second electrode of the capacitor Cst, an expanded part of the first electrode 320 that overlaps with the first gate electrode 240 may become the first electrode of the storage capacitor Cst, and the second insulating layer 1040 interposed therebetween may become the dielectric body of the capacitor Cst.

The first electrode 320 of the capacitor Cst may extend in the second direction D2 to extend beyond the boundaries of the light-emitting unit LU into the neighboring light-emitting units. In the area that overlaps with the first gate electrode 240, the first electrode 320 of the capacitor Cst may become widened. The expanded portion of the first electrode 320 of the capacitor Cst may include an opening that overlaps with a first conductive pattern 441 that will be described later.

The first electrode pattern 350 may be disposed adjacent to the right side of the light-emitting unit LU, between the emission control line 230 and the first scan line 2101 (or an initialization voltage line 310_1). The first electrode pattern 350 may overlap with a second power voltage line 430 that will be described later. In this case, the first electrode pattern 350 may become the first electrode of the auxiliary capacitor Caux, the second power voltage line 430 may become the second electrode of the auxiliary capacitor Caux, and the insulating layer interposed therebetween (i.e., the third insulating layer 1050 that will be described later) may become the dielectric body of the auxiliary capacitor Caux. The configuration of the auxiliary capacitor Caux will be described later with reference to FIGS. 9 and 10 after describing the other elements of the circuit element layer 10a and the display element layer 10b.

The second conductive layer 300 may include at least one metal selected from among Mo, Al, Pt, Pd, Ag, Mg, Au, Ni, Nd, Ir, Cr, Ca, Ti, Ta, W, and Cu. The second conductive layer 300 may be a single- or multilayer film. For example, the second conductive layer 300 may be formed as a stack of TVA/Ti, Mo/Al/Mo, Mo/AlGe/Mo, or Ti/Cu.

The third insulating layer 1050 may be disposed on the second conductive layer 300 and may cover the second conductive layer 300. The third insulating layer 1050 may be disposed on substantially the entire surface of the substrate 1010. The third insulating layer 1050 may include a silicon compound or a metal oxide. For example, the third insulating layer 1050 may include silicon oxide, silicon nitride, silicon oxynitride, aluminum oxide, tantalum oxide, hafnium oxide, zirconium oxide, and titanium oxide. These materials may be used alone or in combination with one another. The third insulating layer 1050 may be a single-layer film or a multilayer film consisting of a stack of different materials.

The third insulating layer 1050 may have a thickness of 5000 Å to 7000 Å or 6000 Å to 6500 Å, for example, about 5000 Å.

The third insulating layer 1050 may include first through eleventh contact holes CNT1 through CNT11. The first through eleventh contact holes CNT1 through CNT11 will be described later together with the third conductive layer 400.

The third conductive layer 400 is disposed on the second insulating layer 1040. The third conductive layer 400 may include a data line 410, a first power voltage line 420, a second power voltage line 430, and first, second, and third conductive patterns 441, 442, and 443.

The data line 410 may be disposed on the left side of the light-emitting element LU and may extend in the first direction D1 to extend beyond the boundaries of the light-emitting unit LU into the neighboring light-emitting units.

The data line 410 may overlap with the second semiconductor region 120. In the overlapping area of the data line 410 and the second semiconductor region 120, the third contact hole CNT3 may be formed through the third insulating layer 1050 to expose the second semiconductor region 120, and the data line 410 may be connected to, or in contact with, the second semiconductor region 120, through the third contact hole CNT3.

The first power voltage line 420 may be disposed in the middle of the light-emitting unit LU and may extend in the first direction D1 to extend beyond the boundaries of the light-emitting unit LU into the neighboring light-emitting units. The first power voltage line 420 may overlap with the first electrode 320 of the capacitor Cst and the fifth semiconductor region 150.

In the overlapping area of the first power voltage line 420 and the first electrode 320 of the capacitor Cst, the seventh, eighth, and ninth contact holes CNT7, CNT8, and CNT9 may be formed through the third insulating layer 1050 to expose the first electrode 320 of the capacitor Cst, and the first power voltage line 420 may be connected to, or in contact with, the first electrode 320 of the capacitor Cst through the seventh, eighth, and ninth contact holes CNT7, CNT8, and CNT9.

Since the first power voltage line 420 and the first electrode 320 of the capacitor Cst are connected to form mesh-type wiring, the drop of the first power voltage QVDD, which is applied to the first power voltage line 420, can be alleviated or prevented.

In the overlapping area of the first power voltage line 420 and the fifth semiconductor region 150, the tenth contact hole CNT10 may be formed through the third insulating layer 1050 to expose the fifth semiconductor region 150, and the first power voltage line 420 may be connected to, or in contact with, the fifth semiconductor region 150 through the tenth contact hole CNT10.

The second power voltage line 430 may be disposed on the right side of the light-emitting unit LU and may extend in the first direction D1 to extend beyond the boundaries of the light-emitting unit LU into the neighboring light-emitting units. The second power voltage line 430 may overlap with the first dummy pattern 290.

In the overlapping area of the second power voltage line 430 and the first dummy pattern 290, the fifth contact hole CNT5 may be formed through the third insulating layer 1050 to expose the first dummy pattern 290, and the second power voltage line 430 may be connected to, or in contact with, the first dummy pattern 290 through the fifth contact hole CNT5.

The second power voltage line 430 may be electrically connected to the second pixel electrode ED2 through a $21^{st}$ contact hole CNT21 that will be described later.

The first conductive pattern 441 may be disposed to overlap with the first gate electrode 240 and may extend in the first direction D1 to overlap with the third semiconductor region 130 (or the fourth semiconductor region 140).

In the overlapping area of the first conductive pattern 441 and the first gate electrode 240, the sixth contact hole CNT6 may be formed through the second and third insulating layers 1040 and 1050 to expose the first gate electrode 240, and the first conductive pattern 441 may be in contact with the first gate electrode 240 through the sixth contact hole CNT6. Similarly, in the overlapping area of the first conductive pattern 441 and the third semiconductor region 130, the fourth contact hole CNT4 may be formed through the first, second, and third insulating layers 1030, 1040, and 1050 to expose the third semiconductor region 130, and the first conductive pattern 441 may be in contact with the third semiconductor region 130 through the fourth contact hole CNT4. That is, the first conductive pattern 441 may electrically connect the gate electrode of the first transistor T1 (and the first electrode of the storage capacitor Cst) and the second electrode of the third transistor T3 (or the second electrode of the fourth transistor T4).

The sixth contact hole CNT6 may be located in the opening of the first electrode 320 of the capacitor Cst. In the sixth contact hole CNT6, the first conductive pattern 441 and the first electrode 320 of the capacitor Cst, which is adjacent to the first conductive pattern 441, may be insulated from each other by the third insulating layer 1050.

The second conductive pattern 442 may be disposed to overlap with the fourth semiconductor region 140 (or the seventh semiconductor region 170) and may extend in the first direction D1 to overlap with the initialization voltage line 310.

In the overlapping area of the second conductive pattern 442 and the initialization voltage line 310, the first contact hole CNT1 may be formed through the third insulating layer 1050 to expose the initialization voltage line 310, and the second conductive pattern 442 may be connected to, or in contact with, the initialization voltage line 310 through the first contact hole CNT1.

In the overlapping area of the second conductive pattern 442 and the fourth semiconductor region 140, the second contact hole CNT2 may be formed through the first, second, and third insulating layers 1030, 1040, and 1050 to expose the fourth semiconductor region 140, and the second conductive pattern 442 may be in contact with the fourth semiconductor region 140 through the second contact hole CNT2. That is, the second conductive pattern 442 may electrically connect the initialization voltage line 310 and the first electrode of the fourth transistor T4 (or the first electrode of the seventh transistor T7).

The third conductive pattern 443 may overlap with the sixth semiconductor region 160 (and the seventh semiconductor region 170) and the first electrode pattern 350.

In the overlapping area of the third conductive pattern 443 and the sixth semiconductor region 160, the eleventh contact hole CNT11 may be formed through the first, second, and third insulating layers 1030, 1040, and 1050 to expose the sixth semiconductor region 160, and the third conductive pattern 443 may be in contact with the sixth semiconductor region 160 through the eleventh contact hole CNT11.

In the overlapping area of the third conductive pattern 443 and the first electrode pattern 350, a $31^{st}$ contact hole CNT31 may be formed through the third insulating layer 1050 to expose the first electrode pattern 350, and the third conductive pattern 443 may be in contact with the first electrode pattern 350 through the $31^{st}$ contact hole CNT31.

The third conductive pattern 443 may be electrically connected to the first pixel electrode ED1 via a $22^{nd}$ contact hole CNT22 (or a second via hole). That is, the third conductive pattern 443 may electrically connect the second electrode of the sixth transistor T6 (and the second electrode of the seventh transistor T7) to the first pixel electrode ED1 and may also electrically connect the first electrode of the auxiliary capacitor Caux to the first pixel electrode ED1.

The third conductive layer 400 may include at least one metal selected from among Mo, Al, Pt, Pd, Ag, Mg, Au, Ni, Nd, Ir, Cr, Ca, Ti, Ta, W, and Cu. The third conductive layer 400 may be a single- or multilayer film. For example, the third conductive layer 400 may be formed as a stack of Ti/Al/Ti, Mo/Al/Mo, Mo/AlGe/Mo, or Ti/Cu.

The fourth insulating layer 1060 (or a passivation film) may be disposed on the third conductive layer 400, substantially on the entire surface of the substrate 1010.

The fourth insulating layer 1060 may insulate the third conductive layer 400 and the micro light-emitting element NED. The fourth insulating layer 1060 may include an organic insulating material such as a polyacrylic resin or a polyimide resin, and the top surface of the fourth insulating layer 1060 may be substantially flat.

The fourth insulating layer 1060 may have a thickness of 15000 Å to 25000 Å or 15000 Å to 20000 Å.

The display element layer 10b will hereinafter be described.

The barrier wall 500 may be disposed on the fourth insulating layer 1060.

The barrier wall 500 may include separate barrier wall portions that correspond to branch parts of the first pixel electrode ED1 and branch parts of the second pixel electrode ED2.

The barrier wall 500 may have a thickness of 150000 Å to 30000 Å or 20000 Å to 25000 Å, for example, about 20000 Å.

The barrier wall 500 may have a tapered cross-sectional shape. That is, the side surfaces of the barrier wall 500 may be inclined and may form an acute angle with the top surface of the fourth insulating layer 1060. In this case, light emitted from the side surfaces of the micro light-emitting element NED may be reflected substantially upwardly by parts of the reflective layer 600 corresponding to the side surfaces of the barrier wall 500 (i.e., an inclined reflective layer 600).

The inclination angle (or taper angle) of the barrier wall 500 may be 60° or less, 20° to 60°, or 40° to 50°. In this case, light emitted from the side surfaces of the micro light-emitting element NED can be reflected substantially upwardly within the area occupied by the light-emitting unit LU.

The first and second pixel electrodes ED1 and ED2 (i.e., first and second pixel electrodes ED1 and ED2 that are formed by the reflective layer 600 and the electrode layer 700) may be disposed on the barrier wall 500 and the fourth insulating layer 1060.

The first and second pixel electrodes ED1 and ED2 will hereinafter be described with reference to FIG. 8.

Figure 8:
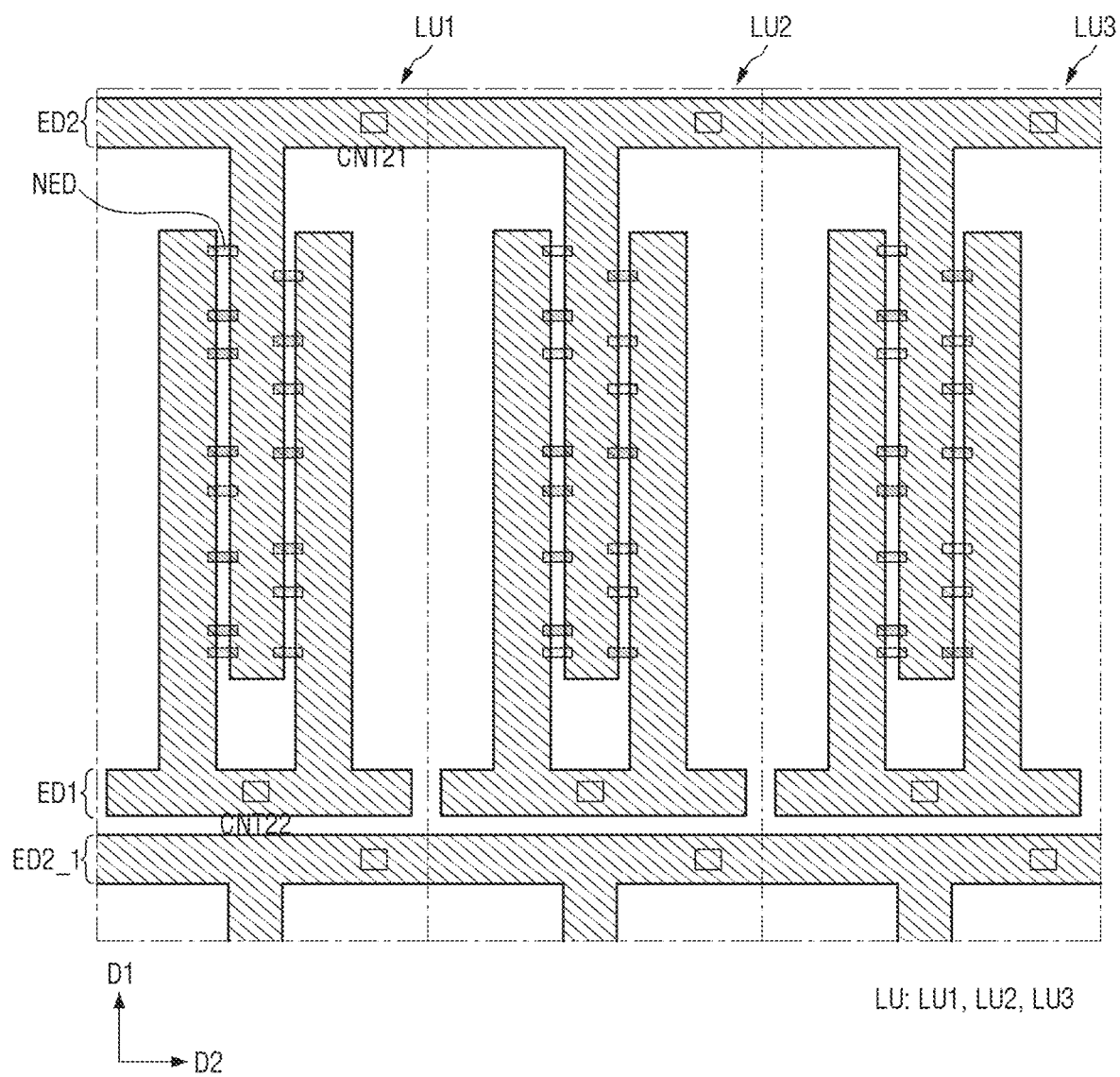
FIG. 8 is a plan view of a display element layer included in the display device of FIG. 3.

FIG. 8 is a plan view of a display element layer included in the display device of FIG. 3.

As illustrated in FIGS. 3 and 8, the first pixel electrode ED1 may include a main body part and branch parts. The main body part of the first pixel electrode ED1 may be disposed to extend in the second direction D2, between the emission control line 230 and the first scan line 2101 (or the initialization voltage line 310_1) in a plan view, and the branch parts of the first pixel electrode ED1 may extend in the first direction DR1 from the main body part. The branch parts of the first pixel electrode ED1 may extend to the second scan line 220 and may overlap with the second scan line 220. As illustrated in FIG. 3, the first pixel electrode ED1 may include first branch parts (or left branch parts) and second branch parts (or right branch parts), the first branch parts may be disposed between the data line 410 and the first gate electrode 240 in a plan view, and the second branch parts may be disposed between the first gate electrode 240 and the second power voltage line 430 in a plan view.

In the overlapping area of the first pixel electrode ED1 and the third conductive pattern 443, the $22^{nd}$ contact hole CNT22 may be formed through the fourth insulating layer 1060 to expose the third conductive pattern 443, and the first pixel electrode ED1 may be connected to, or in contact with the third conductive pattern 443 through the $22^{nd}$ contact hole CNT22. As described above with reference to FIG. 5, since the third conductive pattern 443 is connected to the sixth semiconductor region 160 via the eleventh contact hole CNT11, the first pixel electrode ED1 may be connected to the sixth semiconductor region 160 (i.e., the second electrode of the sixth transistor T6) via the third conductive pattern 443.

Similarly, the second pixel electrode ED2 may include a main body part and branch parts. The main body part of the second pixel electrode ED2 may be disposed to extend in the second direction D2, between the first scan line 210 and the first pixel electrode ED1, which is adjacent to the first scan line 210, in a plan view to extend beyond the boundaries of the light-emitting unit LU into the neighboring light-emitting units.

The branch parts of the second pixel electrode ED2 may extend in the first direction DR1 from the main body part of the second pixel electrode ED2. The branch parts of the second pixel electrode ED2 may extend to the emission control line 230 to substantially overlap with the first gate electrode 240.

In the overlapping area of the second pixel electrode ED2 and the second power voltage line 430, the $21^{st}$ contact hole CNT21 may be formed through the fourth insulating layer 1060 to expose the second power voltage line 430, and the second pixel electrode ED2 may be electrically connected to the second power voltage line 430 via the $21^{st}$ contact hole CNT21.

Referring again to FIG. 4, the reflective layer 600, included in the first and second pixel electrodes ED1 and ED2, may be disposed on the barrier wall 500. The reflective layer 600 may cover the barrier wall 500. The reflective layer 600 may include first and second reflective patterns 610 and 620. The first reflective pattern 610 may form the first pixel electrode ED1, and the second reflective pattern 620 may form the second pixel electrode ED2.

The reflective layer 600 may include a reflective material having reflective characteristics and thereby may be capable of reflecting light (or a material with high reflectance). Here, the reflective material may include at least one selected from among Ag, Mg, Cr, Au, Pt, Ni, Cu, W, Al, aluminum-lithium (Al—Li), magnesium-indium (Mg—In), and magnesium-silver (Mg—Ag).

The electrode layer 700 (or the pixel electrode layer) may be disposed on the reflective layer 600. The electrode layer 700 may cover the reflective layer 600. The electrode layer 700 may include first and second pixel electrode patterns 710 and 720. The first pixel electrode pattern 710 may be formed to be larger than the first reflective pattern 610 and to cover the first reflective pattern 610 and may be in contact with the fourth insulating layer 1060. Similarly, the second pixel electrode pattern 720 may be formed to be larger than the second reflective pattern 620 and to cover the second reflective pattern 620 and may be in contact with the fourth insulating layer 1060.

The electrode layer 700 may have relatively excellent electrical conductivity. The electrode layer 700 may transmit electrical signals received from the circuit element layer 10a to contact electrodes (800 and 900) that will be described later. The electrode layer 700 may include a transparent conductive material. For example, the electrode layer 700 may include indium tin oxide (ITO), indium zinc oxide (IZO), or indium tin-zinc oxide (ITZO), but the present disclosure is not limited thereto.

The fifth insulating layer 1070 may be disposed on parts of the first and second pixel electrodes ED1 and ED2. The fifth insulating layer 1070 may be disposed in the space between the first and second pixel electrodes ED1 and ED2. The fifth insulating layer 1070 may have an island shape or a linear shape that is formed along the spaces between the branch parts of the first pixel electrode ED1 and the branch parts of the second pixel electrode ED2 in a plan view.

The micro light-emitting element NED may be disposed on the fifth insulating layer 1070. The fifth insulating layer 1070 may be disposed between the micro light-emitting element NED and the fourth insulating layer 1060. The bottom surface of the fifth insulating layer 1070 may be in contact with the fourth insulating layer 1060, and the micro light-emitting element NED may be disposed on the top surface of the fifth insulating layer 1070. The fifth insulating layer 1070 may be in contact with the first and second pixel electrodes ED1 and ED2, on both sides thereof, to electrically insulate the first and second pixel electrodes ED1 and ED2.

Figure 11:
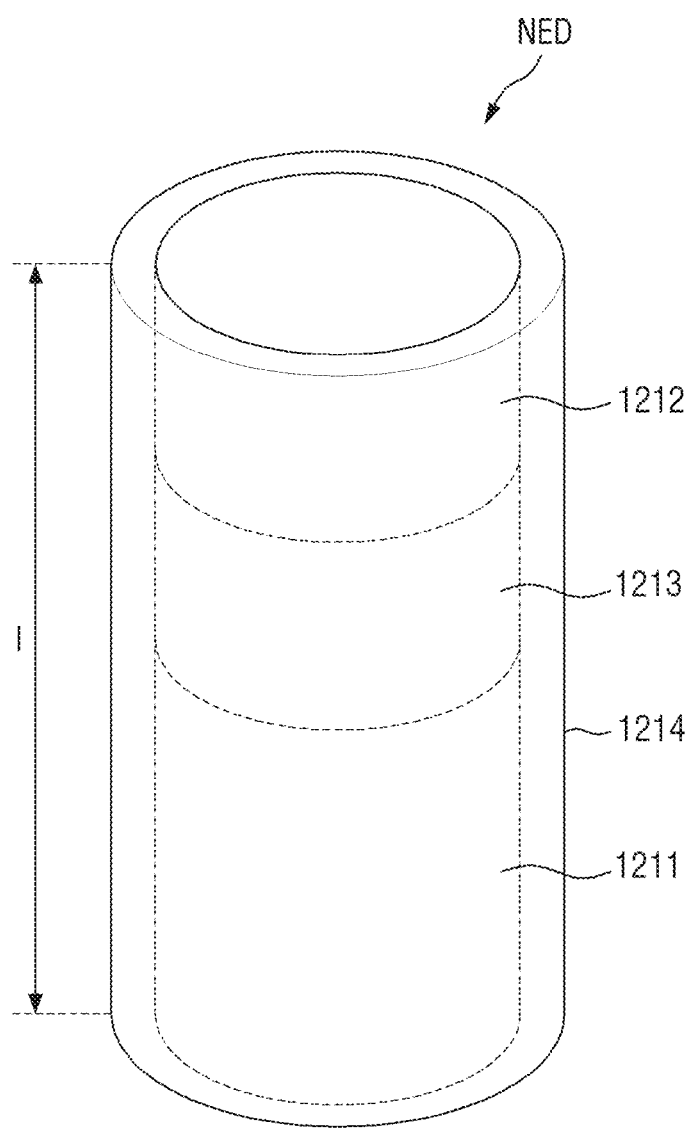
FIG. 11 illustrates a micro light-emitting element included in the display device of FIG. 3.

The fifth insulating layer 1070 may overlap with parts of the first and second pixel electrodes ED1 and ED2, for example, parts of opposing inclined surfaces of the first and second pixel electrodes ED1 and ED2. For example, the ends of the fifth insulating layer 1070 may cover the top surfaces of opposing protruding parts of the first and second pixel electrodes ED1 and ED2. The fifth insulating layer 1070 may protect its overlapping areas with the first and second pixel electrodes ED1 and ED2 and may electrically insulate the first and second pixel electrodes ED1 and ED2. Also, the fifth insulating layer 1070 may prevent first and second semiconductor layers 1211 and 1212 of the micro light-emitting element NED as illustrated in FIG. 11 from being in contact with other elements and may thus prevent the micro light-emitting element NED from being damaged.

At least one micro light-emitting element NED may be disposed between the first and second pixel electrodes ED1 and ED2. FIG. 1 illustrates that micro light-emitting elements NED that emit light of the same color are arranged in each light-emitting unit LU, but the present disclosure is not limited thereto. Alternatively, as already mentioned above, micro light-emitting elements NED that emit light of different colors may be arranged in each light-emitting unit LU.

The first and second pixel electrodes ED1 and ED2 may be disposed to be a predetermined distance apart from each other, and the predetermined distance may be the same as, or smaller than, the length of the micro light-emitting element NED. Accordingly, the first and second pixel electrodes ED1 and ED2 can be properly electrically connected to the micro light-emitting element NED.

The micro light-emitting element NED may be disposed between the first and second pixel electrodes ED1 and ED2, which are spaced apart from each other. The micro light-emitting element NED may emit light of different colors depending on the material of active material layers thereof. Different types of micro light-emitting elements NED may be aligned in different light-emitting units LU to emit light of different colors. For example, micro light-emitting elements NED may emit light of a blue, green, or red wavelength range so that light-emitting units (LU1, LU2, and LU3) may emit blue, green, or red light, but the present disclosure is not limited thereto. Alternatively, micro light-emitting elements NED may emit light of the same wavelength range so that the light-emitting units (LU1, LU2, and LU3) may emit light of the same color (e.g., blue light). Yet alternatively, micro light-emitting elements NED that emit light of different wavelength ranges may be arranged in each light-emitting unit LU so that light of another color (e.g., white light) may be emitted.

The micro light-emitting element NED may be a light-emitting diode (LED). The micro light-emitting element NED may be a nano structure having a size of nanometers. The micro light-emitting element NED may be an inorganic LED (ILED) formed of an inorganic material. In a case where the micro light-emitting element NED is an ILED, a light-emitting material having an inorganic crystalline structure may be arranged between two opposing electrodes. Then, if an electric field is formed in the light-emitting material in a particular direction, the ILEDs may be aligned between the two electrodes where a polarity is formed. This will be described later in detail.

The sixth insulating layer 1080 may be disposed on the micro light-emitting element NED to protect the micro light-emitting element NED and may be disposed between the first and second pixel electrodes ED1 and ED2 to fix the micro light-emitting element NED. Although not specifically illustrated in FIG. 4, the sixth insulating layer 1080 may also be disposed on the outer surfaces of the micro light-emitting element NED to fix the micro light-emitting element NED. The sixth insulating layer 1080 may be disposed on some of the outer surfaces of the micro light-emitting element NED to expose both side surfaces of the micro light-emitting element NED. That is, as the length of the sixth insulating layer 1080 becomes smaller than the length of the micro light-emitting element NED, the sixth insulating layer 1080 may be recessed inwardly from both side surfaces of the micro light-emitting element NED. Accordingly, the fifth insulating layer 1070, the micro light-emitting element NED, and the sixth insulating layer 1080 may be stacked in a stepwise fashion. In this case, as the sixth insulating layer 1080 is arranged like the fifth insulating layer 1070, the first and second contact electrodes 800 and 900 may be in proper contact with the side surfaces of the micro light-emitting element NED.

However, the present disclosure is not limited to this. Alternatively, the length of the sixth insulating layer 1080 and the length of the micro light-emitting element NED may be the same so that the sides of the sixth insulating layer 1080 may be aligned with the sides of the micro light-emitting element NED. Also, in a case where the sixth insulating layer 1080 is patterned together with the fifth insulating layer 1070, the sides of the sixth insulating layer 1080 may be aligned with the sides of the micro light-emitting element NED and with the sides of the fifth insulating layer 1070.

The first and second contact electrodes 800 and 900 may be disposed on the sixth insulating layer 1080. The first contact electrode 800 may be disposed on the first pixel electrode ED1 to overlap with at least part of the sixth insulating layer 1080. The second contact electrode 900 may be disposed on the second pixel electrode ED2 to be spaced apart from the first contact electrode 800 and to overlap with at least part of the sixth insulating layer 1080.

The first and second contact electrodes 800 and 900 may be disposed on the top surfaces of the first and second pixel electrodes ED1 and ED2, respectively. The first and second contact electrodes 800 and 900 may be in contact with the first and second pixel electrode patterns 710 and 720, respectively, on the top surfaces of the first and second pixel electrodes ED1 and ED2, respectively. The first and second contact electrodes 800 and 900 may be in contact with first semiconductor layers 1211 and second semiconductor layers 1212, respectively, of the micro light-emitting element NED. Accordingly, the first and second contact electrodes 800 and 900 may transmit electrical signals applied to the first and second pixel electrodes ED1 and ED2 to the micro light-emitting element NED.

The first contact electrode 800 may be disposed on the first pixel electrode ED1 to cover the first pixel electrode ED1, and the bottom surface of the first contact electrode 800 may be in part in contact with the micro light-emitting element NED and the sixth insulating layer 1080. An end of the first contact electrode 800 that faces the second pixel electrode ED2 may be disposed on the sixth insulating layer 1080. The second contact electrode 900 may be disposed on the second pixel electrode ED2 to cover the second pixel electrode ED2, and the bottom surface of the second contact electrode 900 may be in part in contact with the micro light-emitting element NED and the sixth and seventh insulating layers 1080 and 1090. An end of the second contact electrode 900 that faces the first pixel electrode ED1 may be disposed on the seventh insulating layer 1090.

The first and second contact electrodes 800 and 900 may be disposed on the sixth or seventh insulating layers 1080 or 1090 to be spaced apart from each other. That is, the first and second contact electrodes 800 and 900 may be in contact with the micro light-emitting element NED and the sixth or seventh insulating layers 1080 or 1090, but may not be connected to each other, but apart from each other, on the sixth insulating layer 1080.

The first and second contact electrodes 800 and 900 may include a conductive material. For example, the first and second contact electrodes 800 and 900 may include ITO, IZO, ITZO, or Al, but the present disclosure is not limited thereto.

The first and second contact electrodes 800 and 900 may include the same material as the first and second pixel electrode patterns 710 and 720. The first and second contact electrodes 800 and 900 may be arranged in the same patterns as the first and second pixel electrode patterns 710 and 720, on the first and second pixel electrode patterns 710 and 720, to be in contact with the first and second pixel electrode patterns 710 and 720. The first and second contact electrodes 800 and 900, which are in contact with the first and second pixel electrode patterns 710 and 720, may receive electrical signals applied to the first and second pixel electrode patterns 710 and 720 and may transmit the received electrical signals to the micro light-emitting element NED.

The seventh insulating layer 1090 may be disposed on the first contact electrode 800 to electrically insulate the first and second contact electrodes 800 and 900. The seventh insulating layer 1090 may be disposed to cover the first contact electrode 800, but to not overlap with part of the micro light-emitting element NED and thus to allow the micro light-emitting element NED to be connected to the second contact electrode 900. The seventh insulating layer 1090 may be in part in contact with the first contact electrode 800 and the sixth insulating layer 1080, on the sixth insulating layer 1080. The seventh insulating layer 1090 may be disposed to cover one end portion of the first contact electrode 800, on the sixth insulating layer 1080. As a result, the seventh insulating layer 1090 may protect the first contact electrode 800 and may electrically insulate the first contact electrode 800 from the second contact electrode 900.

An end of the seventh insulating layer 1090 that faces the second pixel electrode ED2 may be disposed to cover the sixth insulating layer 1080 and may be aligned with a side surface of the sixth insulating layer 1080.

The eighth insulating layer 1100 may be formed on the seventh insulating layer 1090 and the second contact electrode 900 to protect the elements disposed on the display element layer 10b (or on the fourth insulating layer 1060) from an external environment. When the first and second contact electrodes 800 and 900 are exposed, the disconnection of the contact electrode material may occur due to damage to the electrodes, and thus, the electrodes may be covered by the eighth insulating layer 1100. That is, the eighth insulating layer 1100 may be disposed to cover the first pixel electrode ED1, the second pixel electrode ED2, and the micro light-emitting element NED. Also, in a case where the seventh insulating layer 1090 is not provided, the eighth insulating layer 1100 may be formed on the first and second contact electrodes 800 and 900. In this case, the eighth insulating layer 1100 may electrically insulate the first and second contact electrodes 800 and 900 from each other.

In some embodiments, the fifth, seventh, and eighth insulating layers 1070, 1090, and 1100 may include an inorganic insulating material. For example, the fifth, seventh, and eighth insulating layers 1070, 1090, and 1100 may silicon oxide ($SiO_x$), silicon nitride ($SiN_x$), silicon oxynitride ($SiO_xN_y$), aluminum oxide ($Al_2O_3$), or aluminum nitride (AlN). The fifth, seventh, and eighth insulating layers 1070, 1090, and 1100 may all be formed of the same material or may be formed of different materials. Various materials that can impart dielectricity to the fifth, seventh, and eighth insulating layers 1070, 1090, and 1100 may be used.

The fifth, seventh, and eighth insulating layers 1070, 1090, and 1100, like the sixth insulating layer 1080, may further include an organic insulating material, but the present disclosure is not limited thereto. The type of the organic insulating material included in the sixth insulating layer 1080 is not particularly limited as long as it does not affect the properties of a light-emitting element solution S (i.e., a solution including the micro light-emitting element NED and for use in the arrangement of the micro light-emitting element NED via an inkjet technique). For example, the organic insulating material may include at least one selected from the group consisting of an epoxy resin, a cardo resin, a polyimide resin, an acrylic resin, a siloxane resin, and a silsesquioxane resin, but the present disclosure is not limited thereto.

Figure 9:
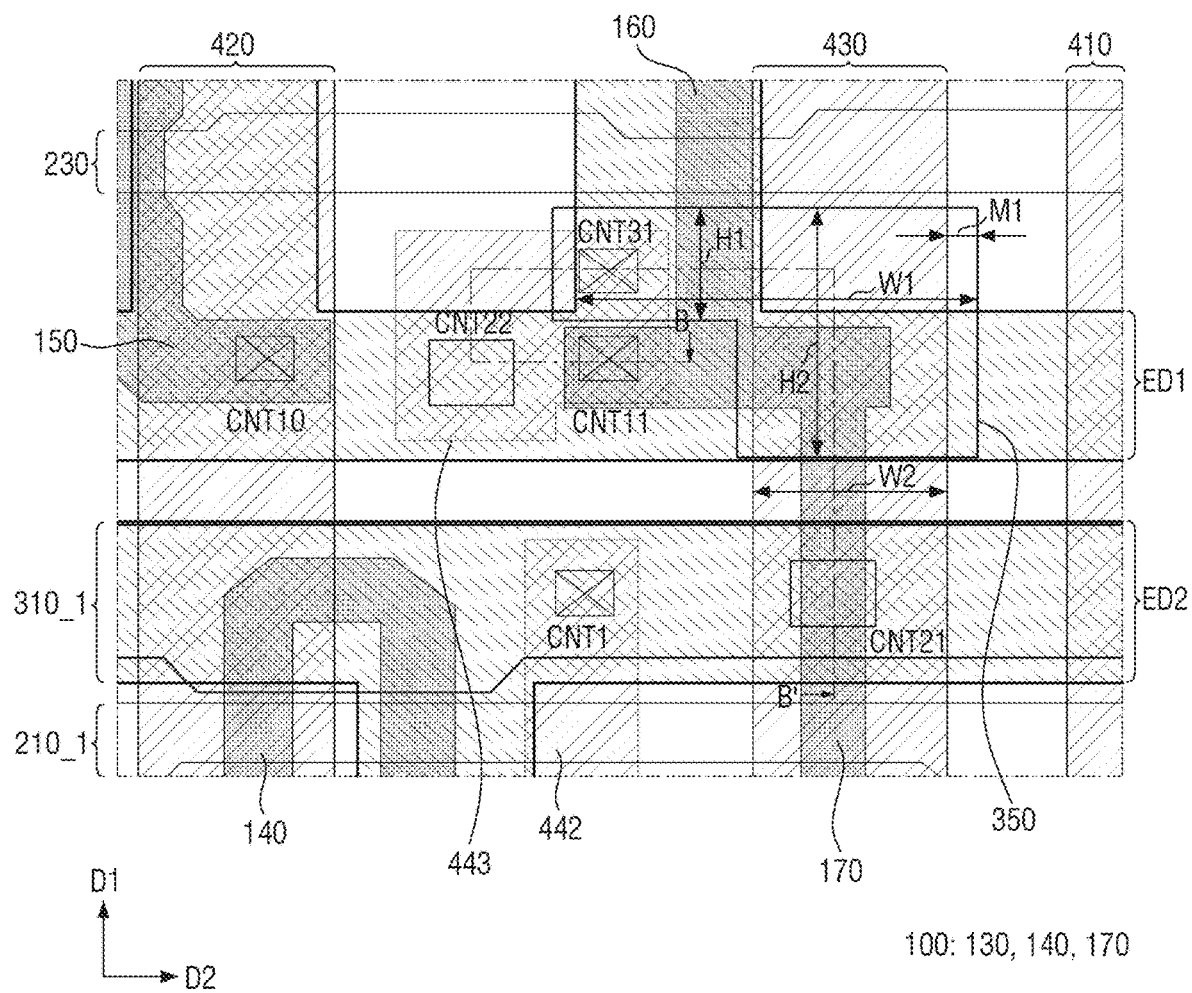
FIG. 9 is an enlarged layout view of an area A1 of FIG. 3.
Figure 10:
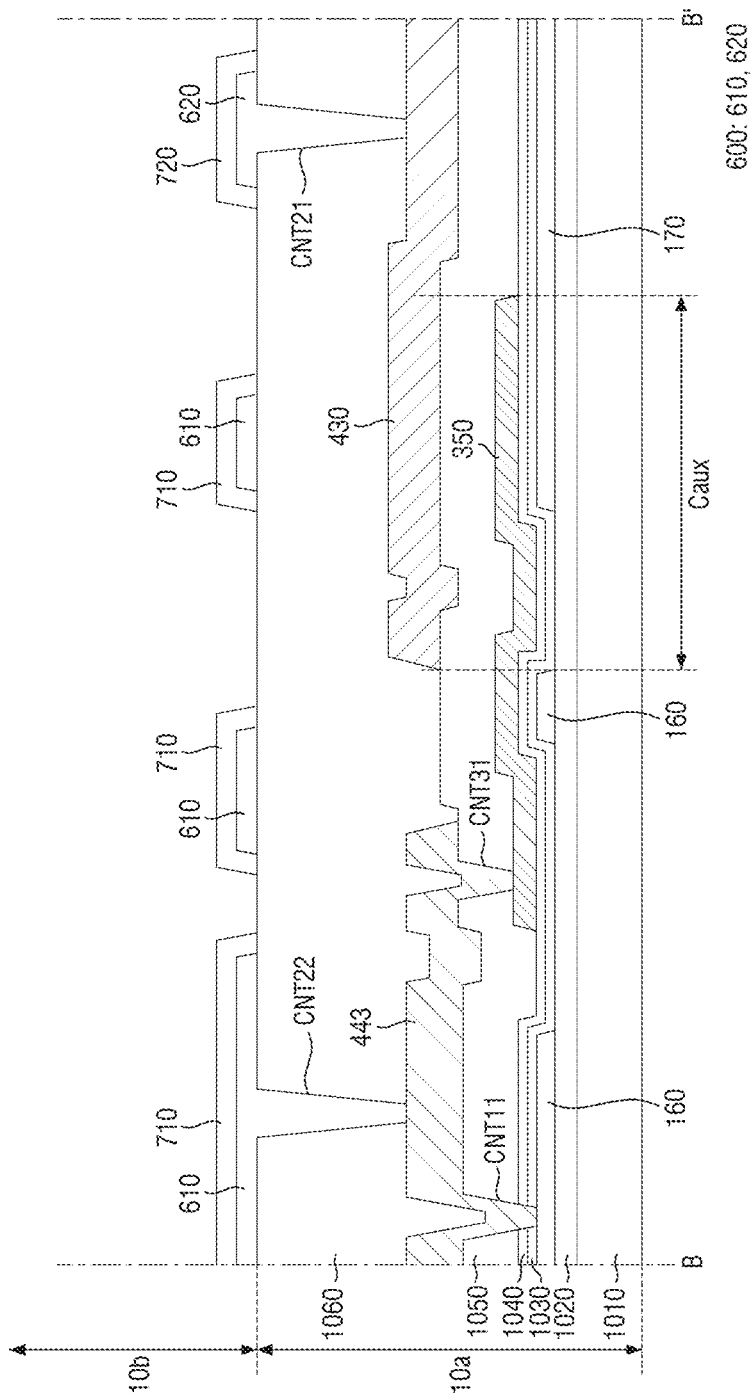
FIG. 10 is a cross-sectional view taken along line B-B' of FIG. 9.

FIG. 9 is an enlarged layout view of an area A1 of FIG. 3. FIG. 10 is a cross-sectional view taken along line B-B' of FIG. 9.

Referring to FIGS. 9 and 10, as already mentioned above, the auxiliary capacitor Caux may be formed in the overlapping area of the first electrode pattern 350 and the second power voltage line 430.

In the overlapping area of one end (or a drain region) of the sixth semiconductor region 160 and the first electrode ED1, the eleventh and $22^{nd}$ contact holes CNT11 and CNT22 may be located. The $22^{nd}$ contact hole CNT22 may be disposed apart in the second direction D2 (or in the leftward direction) from the eleventh contact hole CNT11, but the present disclosure is not limited thereto. For example, the eleventh and $22^{nd}$ contact holes CNT11 and CNT22 may be formed to overlap.

The third conductive pattern 443 may be disposed to cover the eleventh and $22^{nd}$ contact holes CNT11 and CNT22 to electrically connect the sixth semiconductor region 160 and the first pixel electrode ED1 via the eleventh and $22^{nd}$ contact holes CNT11 and CNT22.

Since the first electrode pattern 350 is disposed on the second insulating layer 1040 (or on the second conductive layer 300), the first electrode pattern 350 may bypass the eleventh contact hole CNT11, which is formed through the first, second, and third insulating layers 1030, 1040, and 1050, and may extend in the second direction D2 with respect to the 31st contact hole CNT31 to overlap with the second power voltage line 430. A width W1, in the second direction D2, of the first electrode pattern 350 may be greater than a line width W2 of the second power voltage line 430, and the first electrode pattern 350 may cover the second power voltage line 430 in the second direction D2 in a plan view. For example, the first electrode pattern 350 may protrude from the second power voltage line 430 in the second direction D2 by as much as a first length M1. In this example, even if alignment error arises between the second power voltage line 430 and the first electrode pattern 350 during the fabrication of the display device 1, the capacitance of the auxiliary capacitor Caux may still be uniform because the size of the overlapping area of the first electrode pattern 350 and the second power voltage line 430 does not change.

The $31^{st}$ contact hole CNT31 may be disposed adjacent to the second power voltage line 430 and may be spaced apart from the eleventh contact hole CNT11 in the first direction (or in the upward direction). The first electrode pattern 350 may extend from its overlapping area with the $31^{st}$ contact hole CNT31 in the second direction D2 and may have a width (or length) in the first direction D1 expanded in its overlapping area with the second power voltage line 430. For example, a width H2, in the first direction D1, of the first electrode pattern 350 in the overlapping area of the first electrode pattern 350 and the second power voltage line 430 may be greater than a width H1, in the first direction D1, of the first electrode pattern 350 in a non-overlapping area of the first electrode pattern 350 and the second power voltage line 430.

The size of the overlapping area of the first electrode pattern 350 and the second power voltage line 430 may be 10 μm×10 μm to 20 μm×20 μm. The second power voltage line 430 needs to be separated (or spaced apart) from the data line 410 and the first power voltage line 420, which are disposed in the same layer and extend in the same direction (i.e., in the first direction D1), and needs to be electrically isolated from the third conductive pattern 443, which is adjacent to the second power voltage line 430. Accordingly, the line width (i.e., the width in the second direction D2) of the second power voltage line 430 may be limited to, for example, 20 μm or less, and may be 10 μm or greater in consideration of any voltage drop. Similarly to the second power voltage line 430, the first electrode pattern 350 needs to be electrically isolated from the initialization voltage line 310 and the first electrode 320 of the capacitor Cst, which are disposed in the same layer, and needs not to overlap with the emission control line 340 (for example, the first electrode pattern 350 needs not to overlap with the emission control line 230 to prevent a parasitic capacitor from being additionally formed between the first electrode pattern 350 and the emission control line 230). Accordingly, the width, in the first direction D1, of the first electrode pattern 350 may be limited. For example, the width, in the first direction D1, of the first electrode pattern 350 (or the width, in the first direction D1, of the first electrode pattern 350 in the overlapping area of the first electrode pattern 350 and the second power voltage line 430) may be 20 μm or less. If the width, in the first direction D1, of the first electrode pattern 350 is 10 μm or greater, the capacitance of the auxiliary capacitor Caux may be greater than 0.1 pF. Thus, the size of the overlapping area of the first electrode pattern 350 and the second power voltage line 430 may be 10 μm×10 μm to 20 μm×20 μm.

Since the size of the overlapping area of the first electrode pattern 350 and the second power voltage line 430 is limited to 20 μm×20 μm or less, the distance between the electrodes (i.e., the first electrode pattern 350 and the second power voltage line 430) of the auxiliary capacitor Caux needs to be relatively small. In a case where the first electrode pattern 350 is formed in the second conductive layer 300, which is adjacent to the third conductive layer 400 that includes the second power voltage line 430, the auxiliary capacitor Caux may have a relatively large capacitance.

FIG. 9 illustrates that the sixth semiconductor region 160 is connected to the third conductive pattern 443 through the eleventh contact hole CNT11, and that the third conductive pattern 443 is connected to the first electrode pattern 350 through the $31^{st}$ contact hole CNT31, but the present disclosure is not limited thereto. For example, in a case where the first electrode pattern 350 extends to overlap with the eleventh contact hole CNT11, the sixth semiconductor region 160 may be connected to the first electrode pattern 350, instead of to the third conductive pattern 443, through the eleventh contact hole CNT11.

As described above with reference to FIGS. 3 through 10, the display device 1 may include the first electrode pattern 350 (i.e., the first electrode pattern 350 included in the second conductive layer 300), the second power voltage line 430 (i.e., the second power voltage line 430 included in the third conductive layer 400), and the auxiliary capacitor Caux that includes a portion of the third insulating layer 1050. The auxiliary capacitor Caux can be easily formed without the need of additional processing, depending on the location of the auxiliary capacitor Caux and how the auxiliary capacitor Caux is connected to other elements.

FIG. 11 illustrates a micro light-emitting element included in the display device of FIG. 3.

Referring to FIG. 11, the micro light-emitting element NED may include semiconductor layers (1211 and 1212) and an active material layer 1213 disposed between the semiconductor layers (1211 and 1212). The micro light-emitting element NED may further include an insulating material layer 1214. Electrical signals applied from the first and second pixel electrodes ED1 and ED2 may be transmitted to the active material layer 1213 via the semiconductor layers (1211 and 1212) so that light may be emitted.

The first semiconductor layer 1211 may be an n-type semiconductor layer.

For example, in a case where the micro light-emitting element NED emits light of a blue wavelength range, the first semiconductor layer 1211 may include a semiconductor material $In_xAl_yGa_{1-x-y}N$ (where 0≤x≤1,0≤y≤1, and 0≤x+y≤1). For example, the semiconductor material $In_xAl_yGa_{1-x-y}N$ may be at least one of InAlGaN, GaN, AlGaN, InGaN, AlN, and InN that are doped with an n-type dopant. The first semiconductor layer 1211 may be doped with a first conductive dopant, and the first conductive dopant may be, for example, Si, Ge, or Sn. The first semiconductor layer 1211 may have a length of 1.5 μm to 5 μm, but the present disclosure is not limited thereto.

The second semiconductor layer 1212 may be a p-type semiconductor layer.

For example, in a case where the micro light-emitting element NED emits light of a blue wavelength range, the second semiconductor layer 1212 may include a semiconductor material $In_xAl_yGa_{1-x-y}N$ (where 0≤x≤1,0≤y≤1, and 0≤x+y≤1). For example, the semiconductor material $In_xAl_yGa_{1-x-y}N$ may be at least one of InAlGaN, GaN, AlGaN, InGaN, AlN, and InN that are doped with a p-type dopant. The second semiconductor layer 1212 may be doped with a second conductive dopant, and the second conductive dopant may be, for example, Mg, Zn, Ca, Se, or Ba. The second semiconductor layer 1212 may have a length of 0.08 μm to 0.25 μm, but the present disclosure is not limited thereto.

The active material layer 1213 may be disposed between the first and second semiconductor layers 1211 and 1212 and may have a single- or multi-quantum well structure material, but the present disclosure is not limited thereto. Alternatively, the active material layer 1213 may have a structure in which a semiconductor material having a large band gap energy and a semiconductor material having a small band gap energy are alternately stacked.

The active material layer 1213 may emit light via the combination of electron-hole pairs in accordance with electrical signals applied thereto via the first and second semiconductor layers 1211 and 1212. For example, in a case where the active material layer 1213 emits light of a blue wavelength range, the active material layer 1213 may include a material such as AlGaN or AlInGaN and may include other group Ill or group V semiconductor materials depending on the wavelength of light to be emitted. Accordingly, the type of light emitted by the active material layer 1213 is not particularly limited to light of a blue wavelength range, and the active material layer 1213 may emit light of a red or green wavelength range. The active material layer 1213 may have a length of 0.05 μm to 0.25 μm, but the present disclosure is not limited thereto.

Light may be emitted from the active material layer 1213, not only through the outer surfaces, in the lengthwise direction, of the micro light-emitting element NED, but also through both side surfaces of the micro light-emitting element NED. That is, light is not limited to being emitted from the active material layer 1213 in one particular direction.

The insulating material layer 1214 may be formed on the outside of the micro light-emitting element NED to protect the micro light-emitting element NED. For example, the insulating material layer 1214 may be formed to surround the side surfaces of the micro light-emitting element NED, but may not be formed at both ends, in the lengthwise direction, of the micro light-emitting element NED, for example, at both ends of the micro light-emitting element NED where the first or second semiconductor layers 1211 or 1212 is disposed, but the present disclosure is not limited thereto. The insulating material layer 1214 may include a material having insulating properties, for example, $SiO_x$, $SiN_x$, $SiO_xN_y$, AlN, or $Al_2O_3$. Accordingly, any electrical short circuit that may occur when the active material layer 1213 is in direct contact with the first or second pixel electrode ED1 or ED2 may be prevented. Also, since the insulating material layer 1214 includes the active material layer 1213 and thereby protects the outer surfaces of the micro light-emitting element NED, any decrease in emission efficiency may be prevented.

The insulating material layer 1214 may have a thickness of 0.5 μm to 1.5 μm, but the present disclosure is not limited thereto.

The micro light-emitting element NED may be cylindrical. However, the shape of the micro light-emitting element NED is not particularly limited, and the micro light-emitting element NED may have various other shapes such as a cubical, cuboid, hexagonal prism shape. The micro light-emitting element NED may have a length of 1 μm to 10 μm or 2 μm to 5 μm, preferably about 4 μm. The micro light-emitting element NED may have a diameter of 400 nm to 700 nm, preferably about 500 nm.

In embodiments, the micro light-emitting element NED may further include an electrode layer on either side thereof where the first or second semiconductor layers 1211 or 1212 is disposed. In this case, the insulating material layer 1214 may be formed to extend in the lengthwise direction and to cover the electrode layer, but the present disclosure is not limited thereto. Alternatively, the insulating material layer 1214 may cover only the first semiconductor layer 1211, the active material layer 1213, and the second semiconductor layer 1212 or may cover only parts of the outer surfaces of the electrode layer to expose parts of the outer surfaces of the electrode layer.

The electrode layer may be an ohmic contact electrode, but the present disclosure is not limited thereto. Alternatively, the electrode layer may be a Schottky contact electrode. The electrode layer may include a conductive metal. For example, the electrode layer may include at least one of Al, Ti, In, Au, and Ag.

Figure 12:
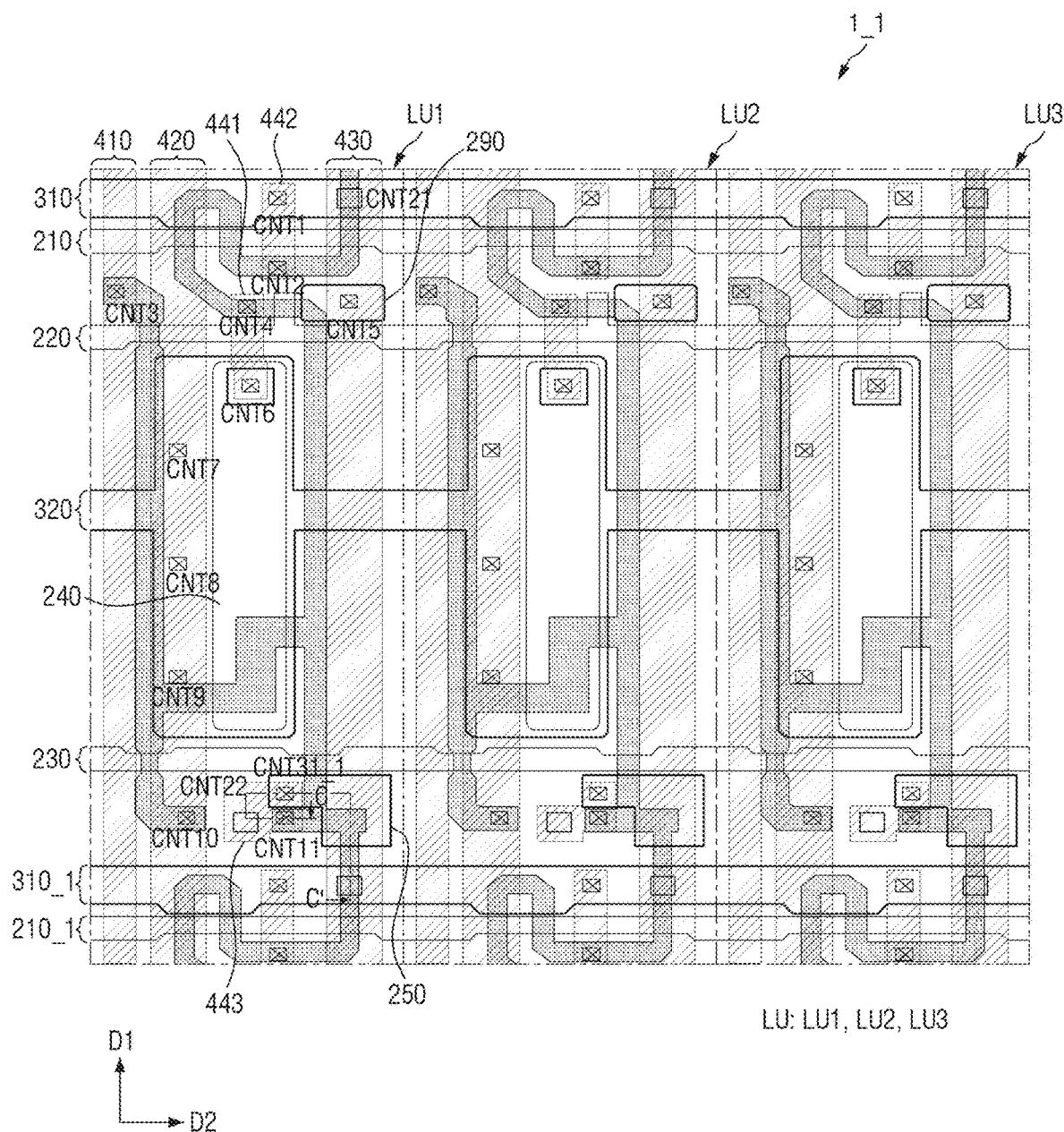
FIG. 12 is a layout view of another example of the display device of FIG. 1.
Figure 13:
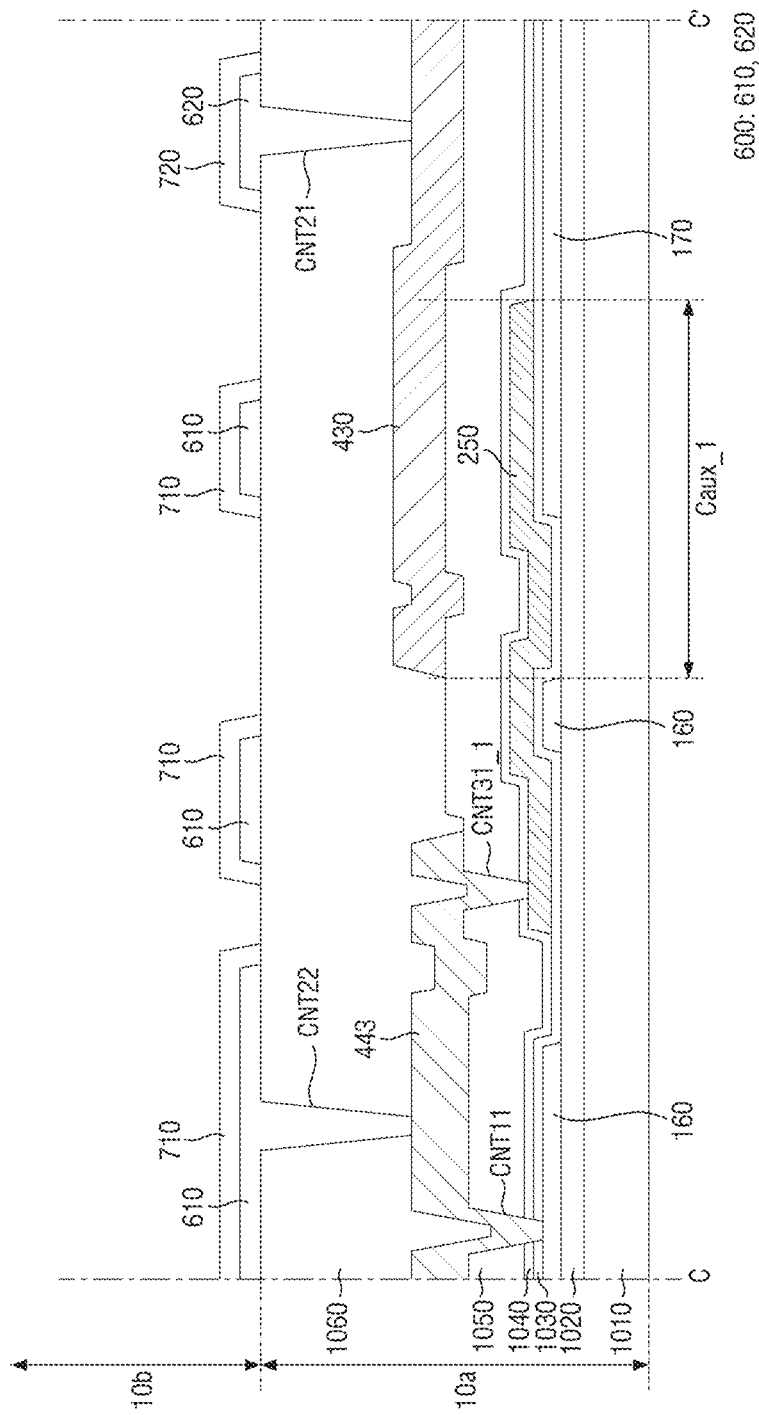
FIG. 13 is a cross-sectional view taken along line C-C' of FIG. 12.

FIG. 12 is a layout view of another example of the display device of FIG. 1. FIG. 13 is a cross-sectional view taken along line C-C' of FIG. 12.

Referring to FIGS. 3, 9, 10, 12, and 13, a display device 1_1 differs from the display device 1 of FIG. 3 in that it includes a second electrode pattern 250, instead of a first electrode pattern 350.

The display device 1_1 is substantially the same as the display device 1 of FIG. 3 except for the second electrode pattern 250, and any redundant description thereof will be omitted. FIG. 12 (and its subsequent drawings) do not illustrate first and second pixel electrodes ED1 and ED2 of a display element layer 10b for describing mainly a circuit element layer 10a of the display device 1_1, and obviously, the display device 1_1, like the display device 1, may include the display element layer 10b.

As illustrated in FIGS. 12 and 13, a first conductive layer 200 may further include the second electrode pattern 250. The second electrode pattern 250 is substantially the same as the first electrode pattern 350 except for its location in a cross-sectional view, and thus, any redundant description thereof will be omitted.

The second electrode pattern 250 may be disposed adjacent to the right side of a light-emitting unit LU, between an emission control line 230 and a first scan line 2101 (or an initialization voltage line 310_1).

As illustrated in FIG. 13, the second electrode pattern 250 may overlap with a second power voltage line 430, in which case, the second electrode pattern 250 may become the first electrode of an auxiliary capacitor Caux_1, the second power voltage line 430 may become the second electrode of the auxiliary capacitor Caux_1, and second and third insulating layers 1040 and 1050 may become the dielectric body of the auxiliary capacitor Caux_1.

In the overlapping area of the second electrode pattern 250 and a third conductive pattern 443, a $31^{st}$ contact hole CNT31_1 may be formed through the second and third insulating layers 1040 and 1050 to expose the second electrode pattern 250, and the second electrode pattern 250 may be in contact with, or connected to, the third conductive pattern 443 through the $31^{st}$ contact hole CNT31_1.

Since the second electrode pattern 250 is spaced relatively apart from the second power voltage line 430 (i.e., more apart than the first electrode pattern 350 from the second power voltage line 430), the capacitance of the auxiliary capacitor Caux_1 may relatively decrease. For example, in a case where the total thickness of the second and third insulating layers 1040 and 1050 is 6000 Å to 9000 Å or 7500 Å to 8000 Å, the auxiliary capacitor Caux_1 may have a smaller capacitance than a capacitor including only the third insulating layer 1050.

Figure 14:
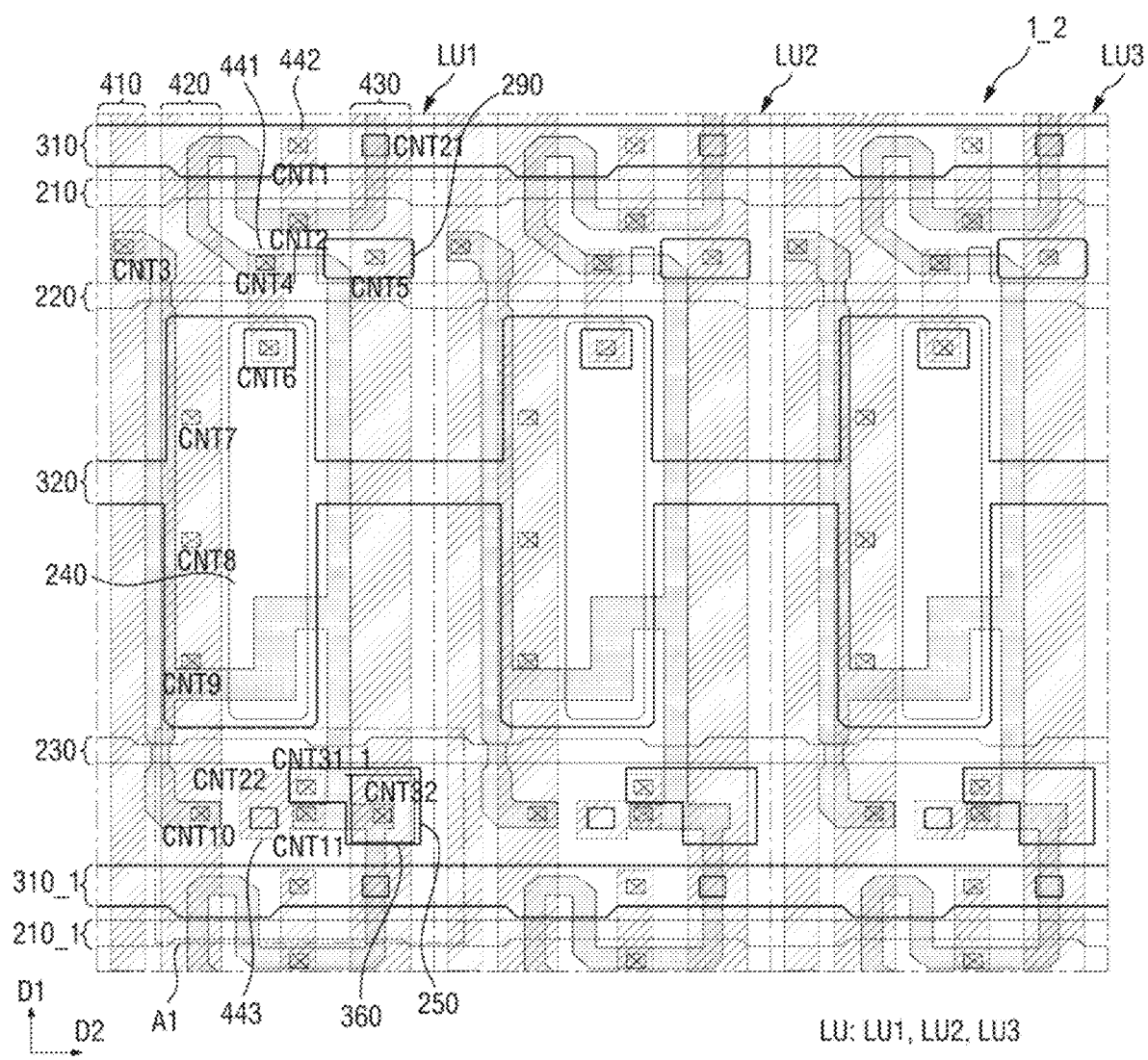
FIG. 14 is a layout view of another example of the display device of FIG. 1.
Figure 15:
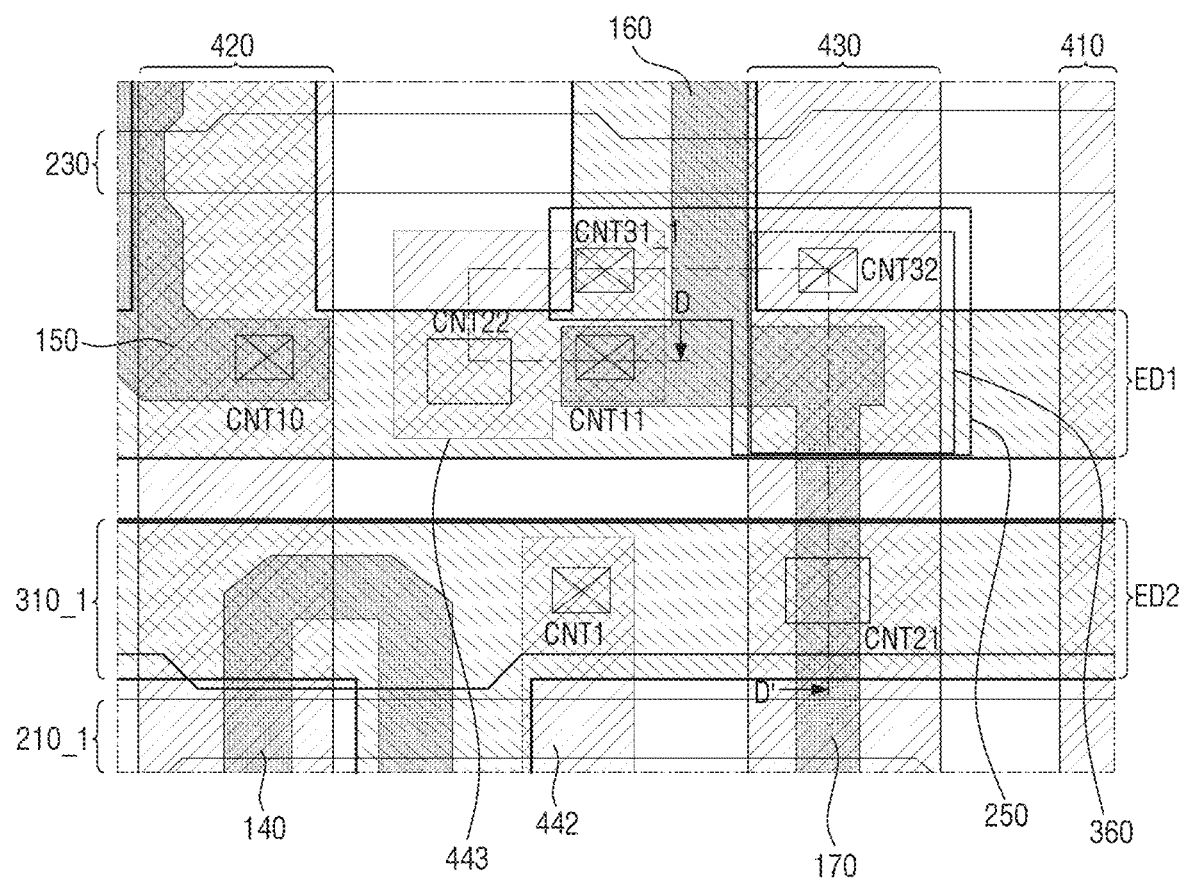
FIG. 15 is an enlarged layout view of an area A1 of FIG. 14.
Figure 16:
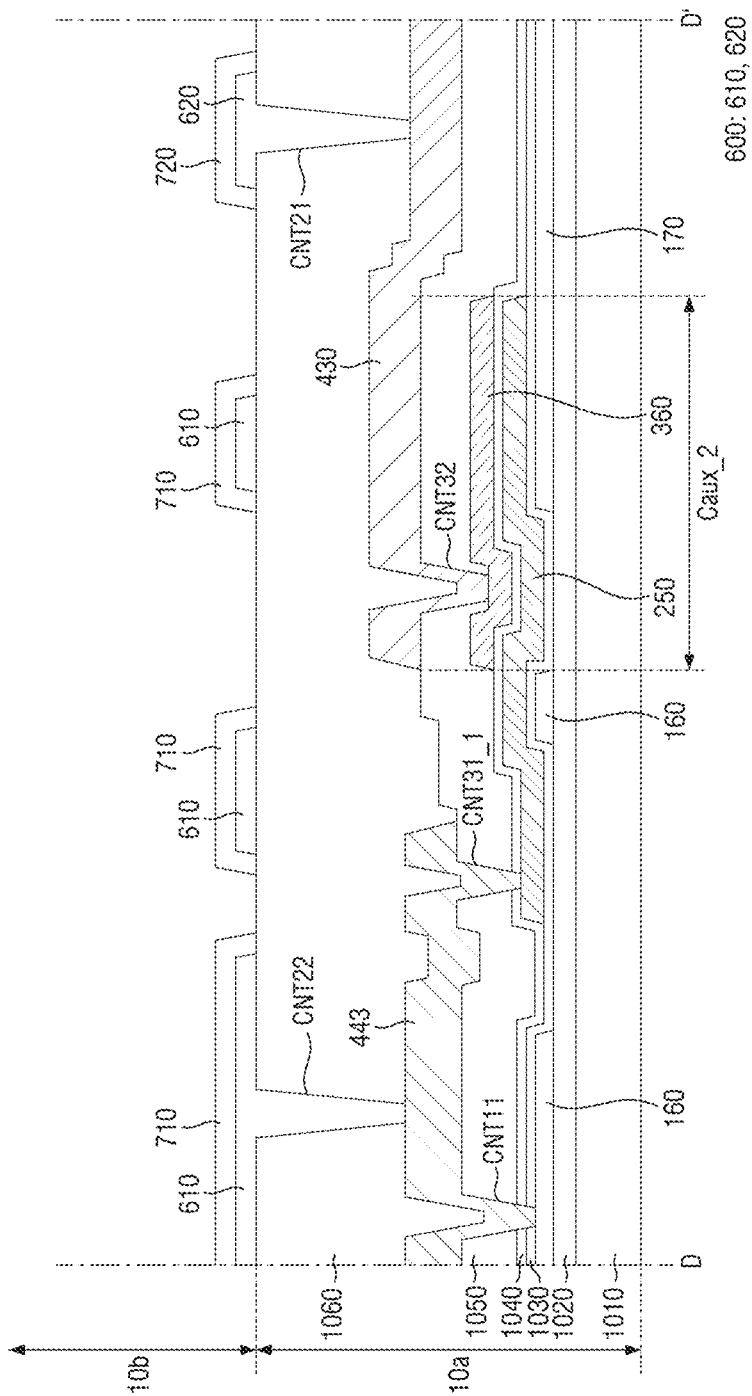
FIG. 16 is a cross-sectional view taken along line D-D' of FIG. 15.

FIG. 14 is a layout view of another example of the display device of FIG. 1. FIG. 15 is an enlarged layout view of an area A1 of FIG. 14. FIG. 16 is a cross-sectional view taken along line D-D' of FIG. 15.

Referring to FIGS. 3, 9, 10, and 14 through 16, a display device 1_2 differs from the display device 1_1 of FIG. 12 in that it further includes a first electrode pattern 360.

The display device 1_2 is substantially the same as the display device 1_1 of FIG. 12 except for the first electrode pattern 360, and thus, any redundant description thereof will be omitted.

A second conductive layer 300 may further include the first electrode pattern 360.

As illustrated in FIG. 15, the first electrode pattern 360 may be disposed between an emission control line 230 and an initialization voltage line 310_1 to overlap with a second power voltage line 430. In the overlapping area of the first electrode pattern 360 and the second power voltage line 430, a $32^{nd}$ contact hole CNT32 may be formed through a third insulating layer 1050 to expose the first electrode pattern 360, and the first electrode pattern 360 may be in contact with, or connected to, the second power voltage line 430 through the 32$^{nd}$ contact hole CNT32.

The first electrode pattern 360 may have the same line width (i.e., the width in a second direction D2) as, or a greater line width than, the second power voltage line 430, but the present disclosure is not limited thereto. As already mentioned above, the size of the first electrode pattern 360 may be determined by the capacitance of an auxiliary capacitor Caux_2 and may be, for example, 10 μm×10 μm to 20 μm×20 μm, when considering design constraints.

As illustrated in FIG. 16, the first electrode pattern 360 may overlap with a second electrode pattern 250, in which case, the second electrode pattern 250 may become the first electrode of an auxiliary capacitor Caux_2, the first electrode pattern 360 may become the second electrode of the auxiliary capacitor Caux_2, and a second insulating layer 1040 may become the dielectric body of an auxiliary capacitor Caux_1.

Since the first and second electrode patterns 360 and 250 are relatively adjacent to each other, the auxiliary capacitor Caux_2 may have a relatively large capacitance. For example, the thickness of the second insulating layer 1040 may be 1000 Å to 2000 Å, and the capacitance of the auxiliary capacitor Caux_2 may be about three to five times the capacitance of the auxiliary capacitor Caux of FIG. 3.

The first and second electrode patterns 360 and 250 may overlap with a data line 410. The first and second electrode patterns 360 and 250 may be disposed on conductive layers (200 and 300) different from the third conductive layer 400 where the data line 410 and the second power voltage line 430 are disposed and may thus further extend in the second direction D2. In this case, the area of the auxiliary capacitor Caux_2 may increase, and the auxiliary capacitor Caux_2 may have an even greater capacitance.

Figure 17:
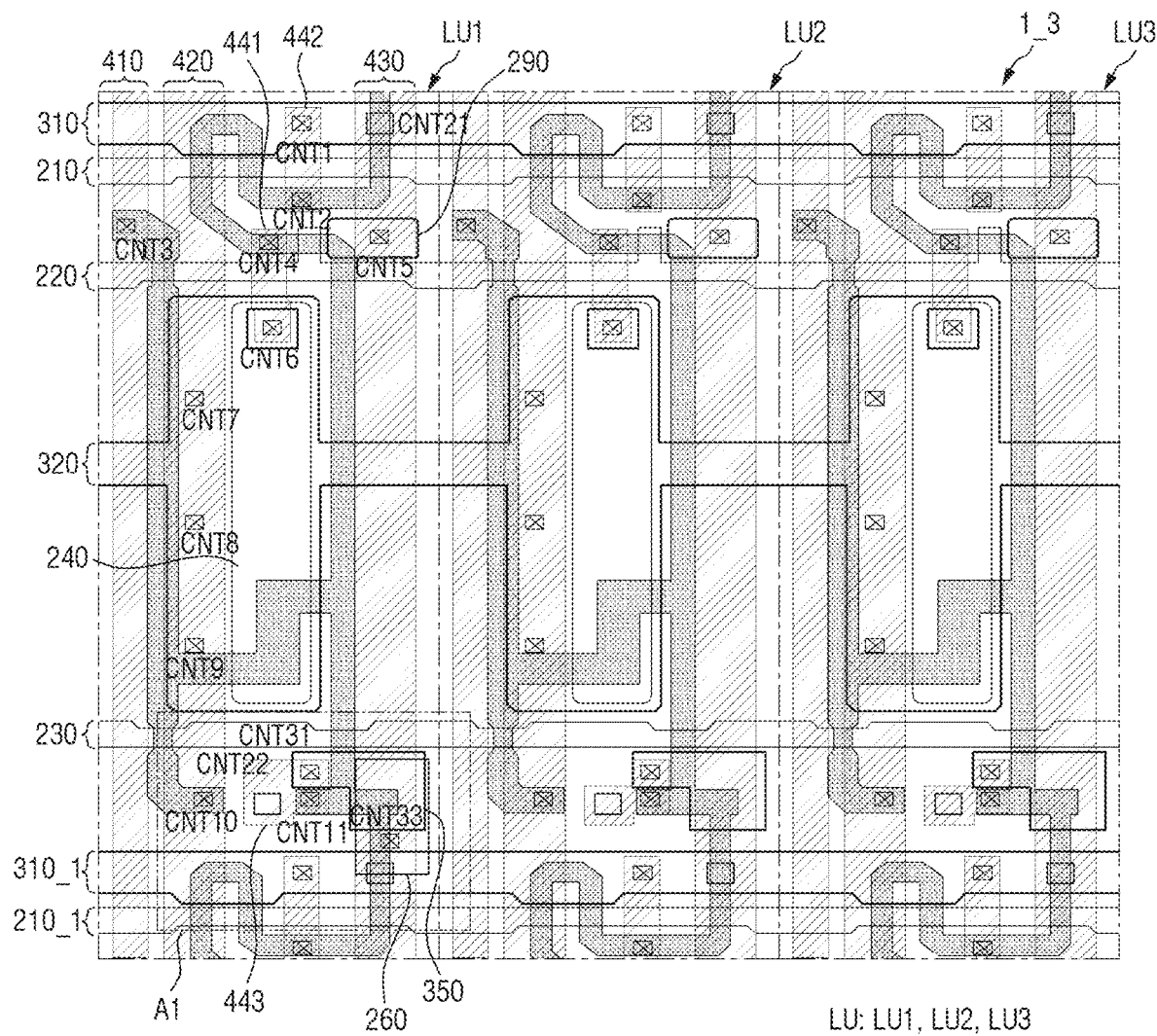
FIG. 17 is a layout view of another example of the display device of FIG. 1.
Figure 18:
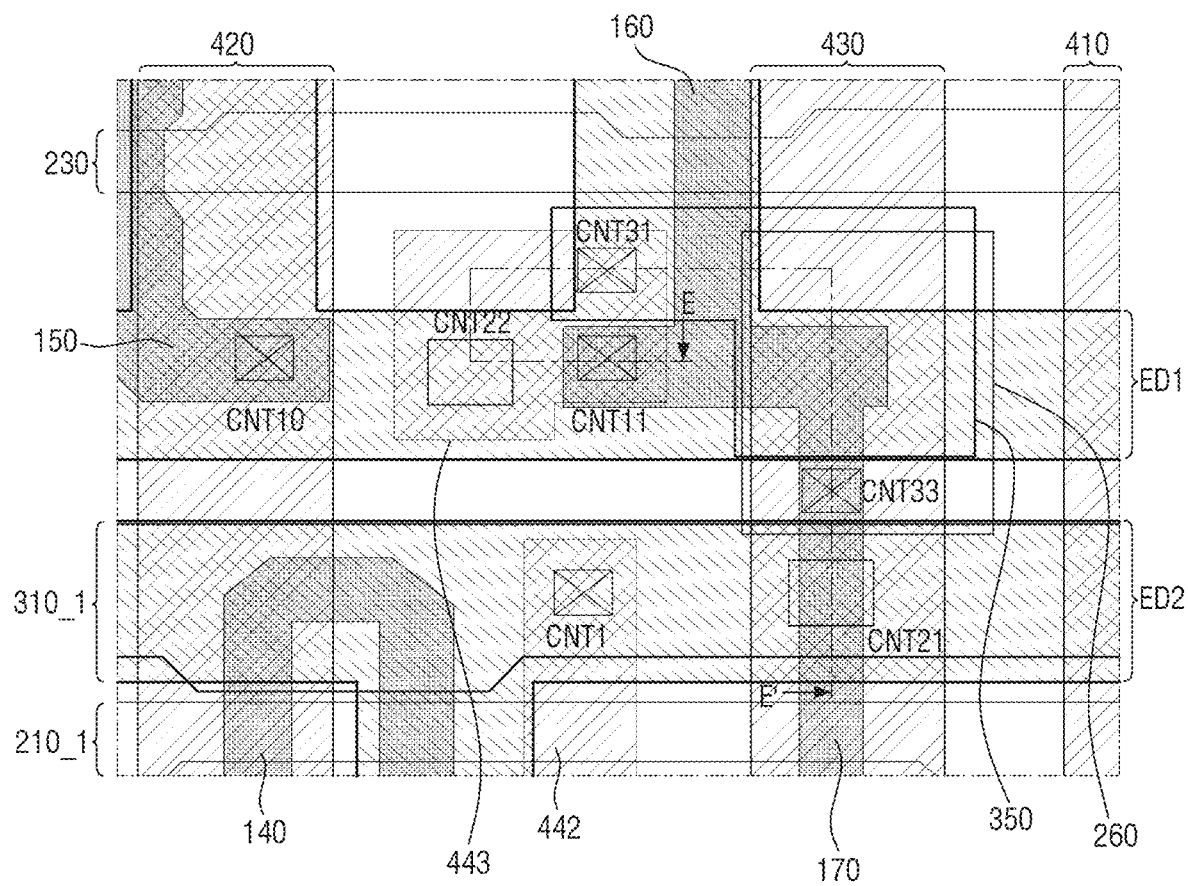
FIG. 18 is an enlarged layout view of an area A1 of FIG. 17.
Figure 19:
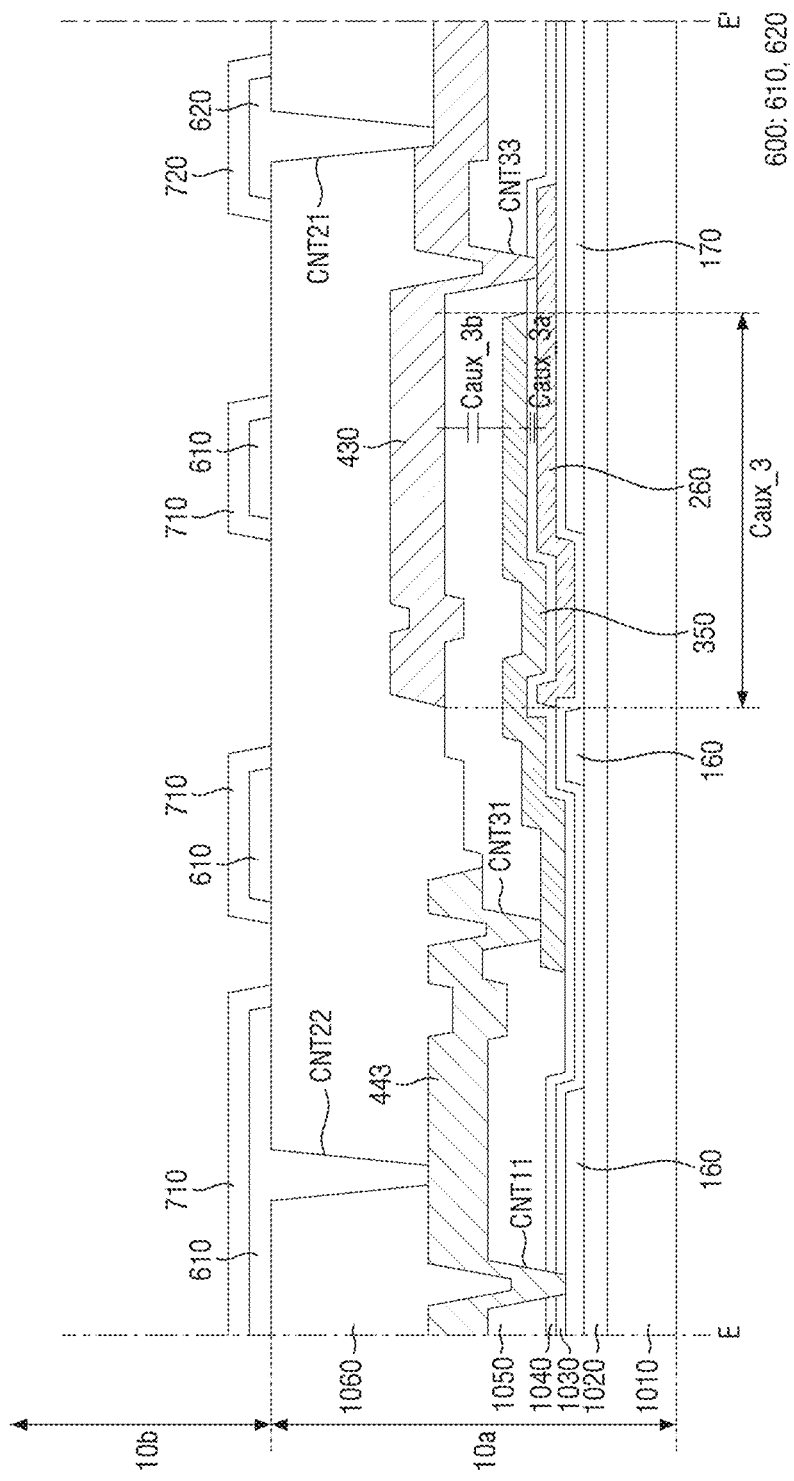
FIG. 19 is a cross-sectional view taken along line E-E' of FIG. 18.

FIG. 17 is a layout view of another example of the display device of FIG. 1. FIG. 18 is an enlarged layout view of an area A1 of FIG. 17. FIG. 19 is a cross-sectional view taken along line E-E' of FIG. 18.

Referring to FIGS. 3, 9, 10, and 17 through 19, a display device 1_3 differs from the display device 1 of FIG. 3 in that it further includes a second electrode pattern 260.

The display device 1_3 is substantially the same as the display device 1 of FIG. 3 except for the second electrode pattern 260, and thus, any redundant description thereof will be omitted.

A first conductive layer 200 may further include the second electrode pattern 260.

As illustrated in FIG. 18, the second electrode pattern 260 may be disposed between an emission control line 230 and an initialization voltage line 310_1 to overlap with a second power voltage line 430. The second electrode pattern 260 may be longer than a first electrode pattern 350 in a first direction D1.

In the overlapping area of the second electrode pattern 260 and the second power voltage line 430, a 33$^{rd}$ contact hole CNT33 may be formed through second and third insulating layers 1040 and 1050 to expose the second electrode pattern 260, and the second electrode pattern 260 may be in contact with, or connected to, the second power voltage line 430 through the 33$^{rd}$ contact hole CNT33.

As illustrated in FIG. 19, the first electrode pattern 350 may overlap with the second electrode pattern 260, in which case, the second electrode pattern 260 may become the first electrode of a first auxiliary capacitor Caux_3a, the first electrode pattern 350 may become the second electrode of the first auxiliary capacitor Caux_3a, and the second insulating layer 1040 may become the dielectric body of the first auxiliary capacitor Caux_3a.

Also, in the overlapping area of the first electrode pattern 350 and the second power voltage line 430, a second auxiliary capacitor Caux_3b (i.e., the auxiliary capacitor Caux of FIG. 3) may be formed. The second auxiliary capacitor Caux_3b may be connected in parallel to the first auxiliary capacitor Caux_3a.

Thus, the total capacitance of an auxiliary capacitor Caux_3 formed by the second electrode pattern 260, the first electrode pattern 350, and the second power voltage line 430 may be the same as the sum of the capacitances of the first and second auxiliary capacitors Caux_3a and Caux_3b. Accordingly, the display device 1_1 may have, in each light-emitting unit LU, an auxiliary capacitor whose capacitance is about four to six times the capacitance of the auxiliary capacitor Caux of FIG. 3.

Figure 20:
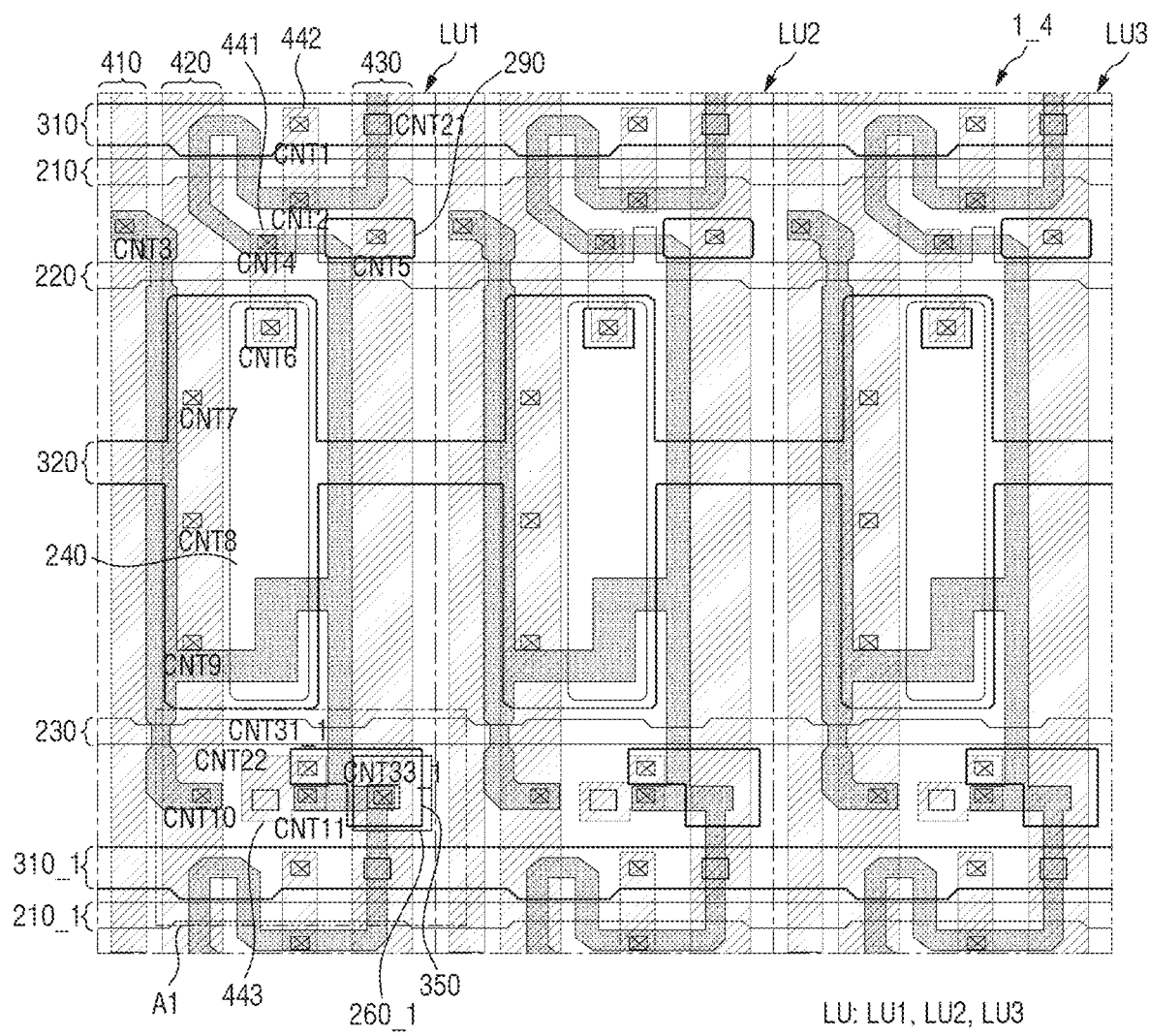
FIG. 20 is a layout view of another example of the display device of FIG. 1.
Figure 21:
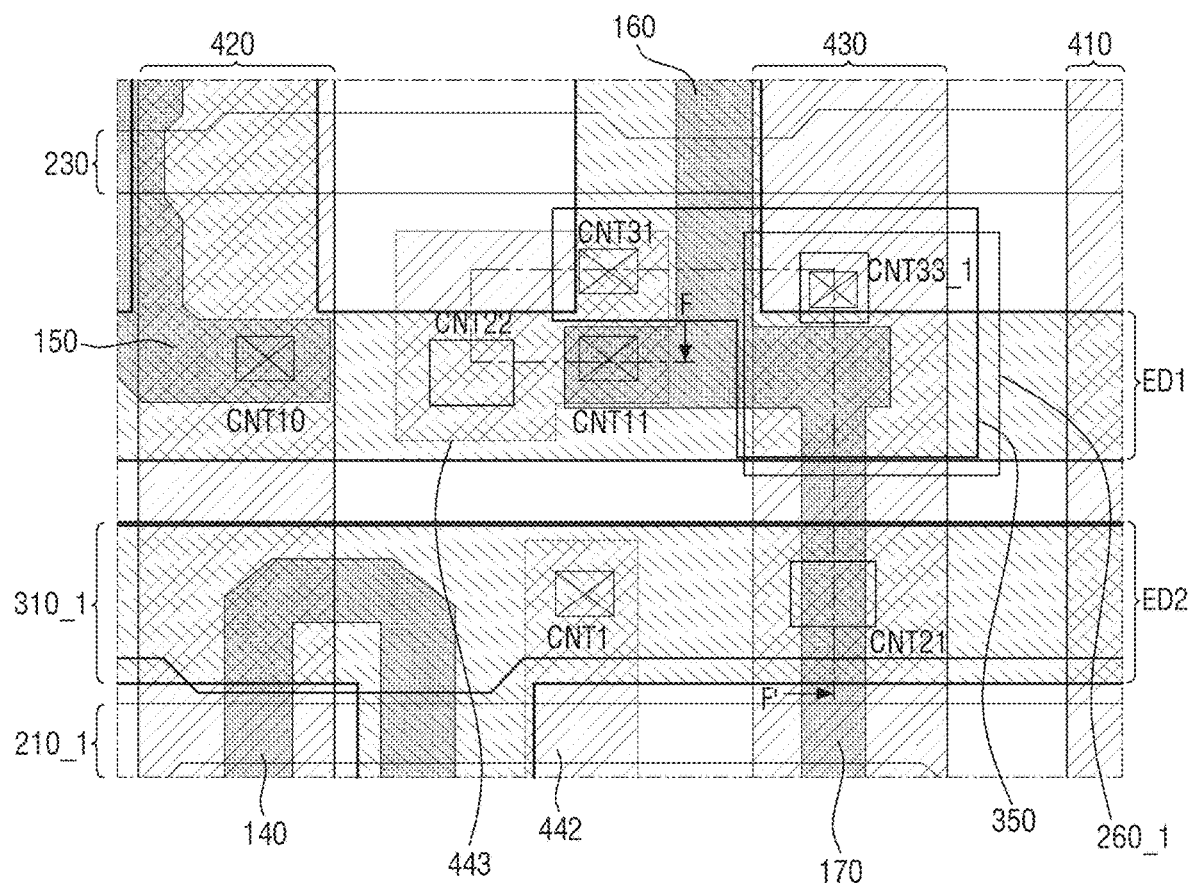
FIG. 21 is an enlarged layout view of an area A1 of FIG. 20.
Figure 22:
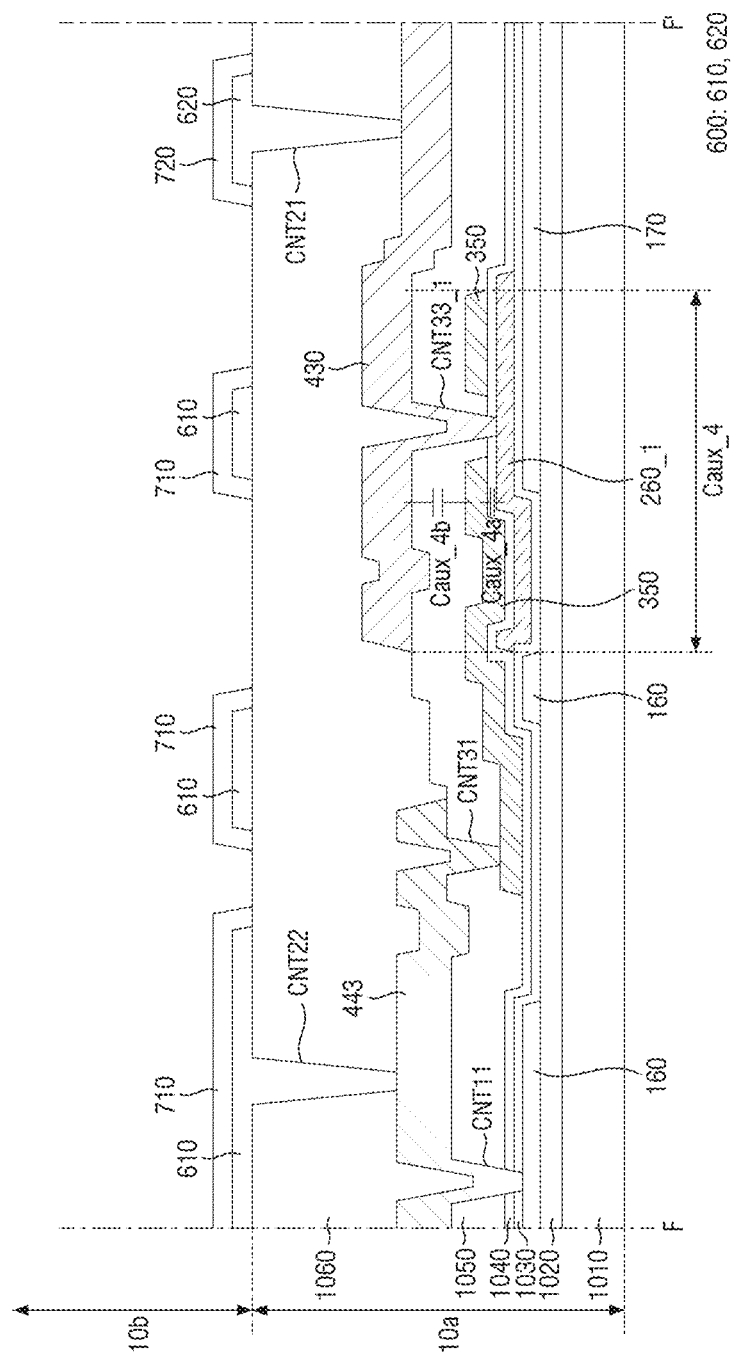
FIG. 22 is a cross-sectional view taken along line F-F' of FIG. 21.

FIG. 20 is a layout view of another example of the display device of FIG. 1. FIG. 21 is an enlarged layout view of an area A1 of FIG. 20. FIG. 22 is a cross-sectional view taken along line F-F' of FIG. 21.

Referring to FIGS. 20 through 22, a display device 1_4 may be substantially the same as the display device 1_3 of FIG. 17 except for a second electrode pattern 260_1 and a 33$^{rd}$ contact hole CNT33_1, and thus, any redundant description thereof will be omitted.

The second electrode pattern 260_1 may be substantially the same as the second electrode pattern 260 of FIGS. 18 and 19 except for its size in a plan view.

As illustrated in FIGS. 21 and 22, the second electrode pattern 260_1 may be disposed between an emission control line 230 and an initialization voltage line 310_1 to overlap with a second power voltage line 430. The second electrode pattern 260 may have the same length in a first direction D1 as a first electrode pattern 350.

As the second electrode pattern 260_1 becomes closer to the initialization voltage line 310_1, the second electrode pattern 260_1 may become more likely to be short-circuited from the initialization voltage line 310_1, or the size of each light-emitting unit LU may increase.

Thus, the 33$^{rd}$ contact hole CNT33_1 may be formed in the overlapping area of the first electrode pattern 350 and the second electrode pattern 260_1. In the overlapping area of the first electrode pattern 350 and the 33$^{rd}$ contact hole CNT33_1, an opening may be formed, the 33$^{rd}$ contact hole CNT33_1 may be located in the opening and may expose the second electrode pattern 260_1 through second and third insulating layers 1040 and 1050, and the second electrode pattern 260_1 may be in contact with, or connected to, the second power voltage line 430 through the 33$^{rd}$ contact hole CNT33_1. In the opening of the first electrode pattern 350, the first electrode pattern 350 and the second power voltage line 430 may be insulated from each other by the third insulating layer 1050.

Similarly to the auxiliary capacitor Caux_3 of FIGS. 17 through 19, an auxiliary capacitor Caux_4 may include third and fourth auxiliary capacitors Caux_4a and Caux_4b, and the third and fourth auxiliary capacitors Caux_4a and Caux_4b may be substantially the same as, or similar to, the first and second auxiliary capacitors Caux_3a and Caux_3b, respectively, of FIG. 19.

As described above with reference to FIGS. 20 through 22, an auxiliary capacitor Caux_4 having an even greater capacitance can be formed without causing a short circuit between the second electrode pattern 260_1 and the initialization voltage line 310_1 or increasing the size of each light-emitting unit LU.

In concluding the detailed description, those skilled in the art will appreciate that many variations and modifications can be made to the disclosed embodiments without substantially departing from the principles of the present disclosure. Therefore, the disclosed embodiments are used in a generic and descriptive sense only and not for purposes of limitation.

What is claimed is:

1. A display device comprising:
a substrate;
a semiconductor layer disposed on the substrate;
a first insulating layer disposed on the substrate and the semiconductor layer;
a first conductive layer disposed on the first insulating layer and including a first electrode pattern;
a second insulating layer disposed on the first insulating layer and the first electrode pattern;
a second conductive layer on the second insulating layer and including a first conductive pattern and a second conductive pattern;
a third insulating layer disposed on the second conductive layer; and
a display element layer disposed on the third insulating layer and including a first electrode, which is electrically connected to the first conductive pattern through a first via hole that penetrates the third insulating layer and a light-emitting element, which is disposed on the third insulating layer,
wherein the first conductive pattern is in contact with the semiconductor layer through a first contact hole that penetrates the first and second insulating layers, and with the first electrode pattern through a second contact hole that penetrates the second insulating layer, and
wherein the second conductive pattern overlaps in part with the first electrode pattern to form a first capacitor with the first electrode pattern.

2. The display device of claim 1,
wherein the light-emitting element is an inorganic light-emitting diode.

3. The display device of claim 1, wherein the first electrode pattern forms a first electrode of the first capacitor, and
wherein a part of the second conductive pattern that overlaps with the first electrode pattern forms a second electrode of the first capacitor.

4. The display device of claim 3, wherein a common voltage is applied to the second conductive pattern.

5. The display device of claim 4, wherein a sum of parasitic capacitance of the light-emitting element and capacitance of the first capacitor is uniform.

6. The display device of claim 1, wherein a capacitance of the first capacitor is about 0.1 pF to about 0.3 pF.

7. The display device of claim 1, further comprising:
a gate insulating layer disposed between the semiconductor layer and the first insulating layer; and
a gate electrode disposed between the gate insulating layer and the first insulating layer to overlap with the semiconductor layer.

8. The display device of claim 7, wherein a thickness of the second insulating layer is about 5000 Å to about 7000 Å.

9. The display device of claim 1, wherein the first conductive layer further includes a gate electrode that overlaps with the semiconductor layer, and
wherein an overlapping area of the semiconductor layer that is overlapped with the gate electrode forms a channel of a transistor.

10. The display device of claim 9, wherein a thickness of the second insulating layer is about 6000 Å to about 9000 Å.

11. The display device of claim 1, further comprising:
an interlayer insulating layer disposed between the first conductive layer and the second insulating layer; and
a third conductive layer disposed between the interlayer insulating layer and the second insulating layer,
wherein the third conductive layer includes a second electrode pattern that is disposed between the first electrode pattern and the second conductive pattern to overlap with the first electrode pattern, and
wherein the second conductive pattern is in contact with the second electrode pattern through a third contact hole that penetrates the second insulating layer to expose the second electrode pattern.

12. The display device of claim 11, wherein a thickness of the interlayer insulating layer is about 1500 Å to about 3000 Å.

13. The display device of claim 1, further comprising:
a gate insulating layer disposed between the semiconductor layer and the first insulating layer; and
a third conductive layer including a second electrode pattern that is disposed between the gate insulating layer and the first insulating layer to overlap with the first electrode pattern,
wherein the second conductive pattern is in contact with the second electrode pattern through a third contact hole that penetrates the first and second insulating layers to expose the second electrode pattern.

14. The display device of claim 13, wherein the first and second electrode patterns form a second capacitor, and
wherein the first capacitor is connected in parallel to the second capacitor.

15. The display device of claim 13, wherein the third contact hole is formed to penetrate the first electrode pattern, and
wherein the first electrode pattern and the second conductive pattern are insulated by the second insulating layer on edges of the third contact hole.

16. A display device comprising:
a substrate;
a circuit element layer disposed on the substrate and including a first transistor, a power line, which extends in a first direction, and a capacitor, which is directly connected to the first transistor and the power line and is disposed to overlap with the power line; and
a display element layer disposed on the circuit element layer and including a first electrode, which is electrically connected to the first transistor, a second electrode electrically connected to the power line, and a material layer disposed between the first and second electrodes,
wherein the material layer is configured to emit light.

17. The display device of claim 16, wherein the circuit element layer further includes a first electrode pattern,
wherein the first electrode pattern overlaps with the first transistor and is electrically connected to the first transistor,
wherein the first electrode pattern extends in a second direction that is perpendicular to the first direction to overlap with, and to be insulated from, the power line, and
wherein the capacitor is formed in an overlapping area of the power line and the first electrode pattern.

18. The display device of claim 17, wherein a part of the first electrode pattern that overlaps with the power line forms a first electrode of the capacitor, and wherein a part of the power line that overlaps with the first electrode pattern forms a second electrode of the capacitor.

19. The display device of claim 17, wherein the circuit element layer includes a first scan line, which extends in the second direction and is connected to a gate electrode of the first transistor, a second scan line, which is spaced apart from the first scan line and extends in the second direction, an initialization voltage line, which extends in the second direction between the first and second scan lines, a third electrode, which is electrically connected to the first electrode, a fourth electrode, which is electrically connected to the initialization voltage line, and a second transistor, which includes a gate electrode that is connected to the second scan line, and wherein the capacitor is located between the first scan line and the initialization voltage line in a plan view.

20. The display device of claim 19, wherein a plurality of insulating layers are interposed between the third and fourth electrodes of the capacitor.

* * * * *